United States Patent [19]
Dougherty

[11] Patent Number: 5,907,622
[45] Date of Patent: May 25, 1999

[54] AUTOMATIC NOISE COMPENSATION SYSTEM FOR AUDIO REPRODUCTION EQUIPMENT

[76] Inventor: A. Michael Dougherty, 110 B Inman St., Cambridge, Mass. 02139

[21] Appl. No.: 08/531,846

[22] Filed: Sep. 21, 1995

[51] Int. Cl.⁶ .................................................. H03G 3/20
[52] U.S. Cl. ........................................ 381/57; 381/108
[58] Field of Search ............................. 381/56, 57, 58, 381/68.2, 68.4, 102, 104–108, 86, 107; 455/22

[56] References Cited

U.S. PATENT DOCUMENTS

| | | |
|---|---|---|
| 4,061,874 | 12/1977 | Frickle et al. . |
| 4,247,955 | 1/1981 | Weidmann . |
| 4,479,237 | 10/1984 | Sugasawa . |
| 4,553,257 | 11/1985 | Mori et al. . |
| 4,558,460 | 12/1985 | Tanaka et al. . |
| 4,641,344 | 2/1987 | Kasai et al. . |
| 4,868,881 | 9/1989 | Zwicker et al. . |
| 4,944,018 | 7/1990 | Bose et al. . |
| 5,018,205 | 5/1991 | Takagi et al. . |
| 5,034,984 | 7/1991 | Bose . |
| 5,107,539 | 4/1992 | Kato et al. .................... 381/57 |
| 5,204,971 | 4/1993 | Takahashi et al. . |
| 5,208,866 | 5/1993 | Kato et al. . |
| 5,396,562 | 3/1995 | Ishimitsu et al. . |
| 5,509,081 | 4/1996 | Kuusama ........................ 381/57 |
| 5,550,922 | 8/1996 | Becker ............................ 381/57 |
| 5,640,450 | 6/1997 | Watnabe ......................... 381/57 |

FOREIGN PATENT DOCUMENTS 2 254 979  10/1992  United Kingdom .

*Primary Examiner*—Vivian Chang
*Attorney, Agent, or Firm*—Lappin & Kusmer LLP

[57] ABSTRACT

The disclosed audio signal processing system produces an acoustic signal in a listening space and includes devices for generating a desired volume signal, a noise signal representative of ambient noise conditions in the listening space, and an audio signal. The system further includes a variable gain amplifier for amplifying the audio signal in response to a gain control signal and a device for generating the gain control signal in response to a volume control signal. The volume control signal is generated in response to the noise and desired volume signals so that the volume control signal increases in response to increases in the noise signal. The volume control signal increases at a rate of increase and the rate of increase decreases as the volume control signal increases.

54 Claims, 14 Drawing Sheets

AUTOMATIC NOISE COMPENSATION SYSTEM FOR AUDIO REPRODUCTION EQUIPMENT

CROSS-REFERENCE TO RELATED APPLICATIONS

This application is related to U.S. patent application Ser. No. 08/531,717, entitled NOISE ESTIMATING SYSTEM FOR USE WITH AUDIO REPRODUCTION EQUIPMENT, invented by the present inventor, and filed concurrently with the present application (Attorney Docket No. DOHL-111).

BACKGROUND OF THE DISCLOSURE

The present invention relates to systems for improving the perceived quality of an acoustic signal in the presence of ambient noise. More specifically, the invention relates to systems for automatically adjusting the gain and the compression of an audio signal for use in audio reproduction systems which use a recorded or transmitted audio signal to generate an audible acoustic signal.

As is well known, human perception of acoustic signals, such as music signals generated by an audio reproduction system, is affected by the presence of ambient noise. Therefore, audio reproduction systems designed to operate in noisy environments, such as inside an automobile, often contain components which attempt to compensate for the degradation caused by noise.

Ambient noise in automobiles, caused for example by the engine or the interaction of the tires and the road surface, is usually concentrated below approximately 200 Hz. Such low frequency ambient noise causes at least three distinct types of problems for automotive audio reproduction systems. First, the volume perceived by a listener, commonly referred to as the "apparent volume", is a function of the noise such that the apparent volume decreases as the noise increases. Listeners may wish to maintain the apparent volume at a constant level, but this is difficult since the ambient noise changes dynamically in an automobile (e.g., with changing road conditions and changing vehicle speeds). This problem is referred to as the "apparent volume problem". Second, since the noise is concentrated in the low frequency range, acoustic signals in automobiles are masked more in the lower frequency ranges than in the higher frequency ranges thus causing the signals to lose their desired tone. This problem is referred to as the "uneven masking problem". Third, the presence of ambient noise reduces the dynamic range of acoustic signals which a listener can perceive. Thus, during relatively high ambient noise conditions, soft passages of music may be entirely masked by the noise, and efforts to increase the volume setting to make the soft passages audible (e.g., by turning up the volume control knob) may make louder passages too loud for listener comfort. So in the presence of noise, ideally, desired acoustic signals are compressed to permit a listener to comfortably hear the entire signal. This problem is referred to as the "dynamic range problem".

One prior art method of compensating for the apparent volume problem, referred to as the "noise-only-method", involves increasing the gain of the audio signal as a function of the ambient noise. This method prevents soft passages from being overwhelmed by the noise. However, the method is disadvantageous because it varies the gain irrespective of the volume level set by the user, so the method increases the gain in response to increasing noise even for very high volume levels which may result in producing signals which are painfully loud for a listener, harmful to the audio reproduction equipment, or both.

U.S. Pat. No. 4,479,237 teaches a system for compensating for the apparent volume problem which varies the gain 'c' of the audio signal according to the relation shown in Equation (1)

$$c = a + n\left(k_1 - \frac{a}{k_2}\right) \quad (1)$$

in which 'n' represents the noise power level, 'a' is the manually set volume level (i.e., 'a' is determined by the position of the volume control knob), and $k_1$ and $k_2$ are constants. This system is an improvement over the noise-only-method because when the manually set volume level is high (i.e., when the $[k_1-a/k_2]$ term is relatively small), the system only increases the gain by a relatively small amount in response to increasing noise and thus prevents the system from generating dangerously high signals. Further, when the manually set volume level is low (i.e., when the $[k_1-a/k_2]$ term is relatively large) the system significantly increases the gain in response to increasing noise levels and thus prevents increasing noise from overly decreasing the apparent volume. However, this system is disadvantageous because the simple linear function of Equation (1) does not adjust the gain aggressively enough to maintain the apparent volume at an optimal level. Further, this system does nothing to address the uneven masking problem or the dynamic range problem.

A well known approach to compensating for the dynamic range problem involves compressing the audio signal by increasing, or boosting, the gain of the audio signal when the level of the audio signal is relatively small (so that signals near the noise floor are boosted above the floor) and by maintaining the gain of the audio signal at a constant, or by varying the gain only slightly, when the level of the audio signal is relatively large (so signals that are already loud are not further boosted). In this manner a signal with a dynamic range of say 40 dB may be compressed to a range of 20 dB to insure that all of the signal is louder than the noise. U.S. Pat. No. 4,641,344 describes one system using this approach in which the amount of compression applied is determined by the ambient noise. This system is disadvantageous because it compresses the audio signal in response to noise even when the entire audio signal could be comfortably perceived without any compression.

U.S. Pat. No. 4,944,018 teaches another system for compensating for the dynamic range problem. This system compresses the audio signal so that the smallest expected audio signal is boosted so that it is comparable to the noise level. This system is disadvantageous in that the amount of compression applied by the system, which is determined by the noise level, is also determinative of the maximum volume level, so the maximum volume level fluctuates with the noise level.

U.S. Pat. No. 5,208,866 teaches another system for compensating for the apparent volume problem and the dynamic range problem. This system generates a control signal by calculating the difference between the audio signal level and the noise level inside the vehicle, and uses this control signal to adjust the volume and the amount of compression. This system is disadvantageous because the amount of compression it provides fluctuates with changes in the audio signal level.

In general, systems designed to compensate for either the apparent volume, uneven masking, or dynamic range problems require some way of estimating the power level of the ambient noise. Automotive audio reproduction systems often use a microphone disposed inside the passenger compartment of the automobile to measure the noise, however, the use of microphones has several disadvantages. Since the microphone is generally sensitive to all sounds in the automobile (including the acoustic signals generated by the audio reproduction system) and not just the noise, it is generally necessary to filter the signal generated by the microphone to generate a signal representative of the noise. One method of filtering the microphone output signal is to use a low pass filter to remove all frequencies in which the acoustic signal may be present. This, however, generates a signal that is representative only of the sub-audio low-frequency noise and not the actual masking noise in the higher frequencies. Another method of filtering the microphone output signal is to determine the contribution made to the microphone output signal by the acoustic signal (which was generated by the audio reproduction system) and to subtract this contribution from the microphone output signal and thereby obtain a signal representative of the noise. This method is disadvantageous because it requires additional circuitry and also requires knowledge of the transfer function from the speakers of the audio reproduction system to the microphone. This transfer function is difficult to determine and moreover it varies dynamically, e.g., with changes in the number of passengers in the vehicle and changes in vehicle parameters such as window position. Further, methods of filtering the microphone output signal generally do not permit measurement of ambient noise in the frequency range which is occupied by human speech, and therefore do not describe fluctuations in the frequency distribution of the noise. Finally, microphones are relatively expensive.

Another method of measuring the noise in an automobile is to construct a filter which transforms the output signal of a sensor, such as a speedometer, into a signal representative of the noise. This method is generally less expensive than those which use microphones, however this method also has several disadvantages. In general, there is no determinative relationship between a single sensor output signal and the noise since the noise depends on several factors such as vehicle speed, wind velocity, and the smoothness of the road surface. Systems of this type, such as the one described in U.S. Pat. No. 4,558,460, therefore generally provide only a relatively inaccurate measurement of the noise.

It is therefore an object of the invention to provide an improved system for compensating for the apparent volume, uneven masking, and dynamic range problems.

It is a further object of the invention to provide an improved system for estimating the ambient noise in a noisy environment.

Other objects and advantages of the present invention will become apparent upon consideration of the appended drawings and description thereof.

SUMMARY OF THE INVENTION

The foregoing and other objects are achieved by the invention which in one aspect comprises an audio signal processing system for application to an audio transducer to produce an acoustic signal in a listening space such as for example in a passenger compartment of a vehicle, a restaurant, a boat, or an outdoor theatre. Such application to an audio transducer may correspond to direct application to an audio transducer, such as a loudspeaker, or to indirect application to an audio transducer such as via an amplifier. Such systems may be used to construct audio reproduction systems. The audio signal processing system includes devices for generating a desired volume signal and a noise signal representative of the ambient noise in the listening space. The system further includes a variable gain amplifier for amplifying an audio signal in accordance with a gain control signal, and the gain control signal is generated in response to a volume control signal. The volume control signal is generated in response to the desired volume signal and the noise signal so that the volume control signal increases in response to increases in the noise signal, and the rate of increase of the volume control signal decreases as the volume control signal increases from a first value to a second value.

The volume control signal may be generated by summing the desired volume signal and a product signal, and the product signal may be generated by multiplying the noise signal and a rate signal. The rate signal may be generated so that it decreases as the volume control signal increases and so that it increases as the volume control signal decreases.

The audio signal processing system may also generate a compression signal for controlling the compression of the audio signal. The compression signal may be generated in response to the audio, noise, and volume control signals, and the gain control signal may be generated by summing the volume control signal and the compression signal. The compression signal may be generated by multiplying a power signal and a compression setting signal. The power signal may be related to the power of the audio signal so that the power signal decreases as the audio signal increases from a first value to a second value, and the compression setting signal may be related to the difference between the volume control signal and the noise signal.

The audio system may be a multi-band system and include devices for generating a plurality of noise signals, each noise signal being representative of the ambient noise in an associated frequency band. In this form the system may also generate a plurality of audio signals, a plurality of volume control signals, a plurality of compression signals, and a plurality of gain control signals. Each volume control signal is generated in response to the desired volume signal, and a corresponding one of the noise signals. Each compression signal is generated in response to corresponding audio, noise, and volume control signals. Each gain control signal is generated in response to corresponding volume control and compression signals, and each audio signal is amplified in accordance with a corresponding one of the gain control signals.

In some forms, one of the noise signals may be generated by scaling another of the noise signals by a constant. Also, the boost added to the desired volume signal to generate one of the volume control signals may be generated simply by scaling the boost used to generate another of the volume control signals. Similarly, one of the compression setting signals which are used to generate the compression signals may be generated by scaling another of the compression setting signals by a constant.

In other forms, the system may include scaling devices for scaling the desired volume signal by a plurality of constants to generate a plurality of scaled volume signals. In this form, each of the volume control signals is generated in response to one of the scaled volume signals and one of the noise signals. The constants may be chosen so that the perceived tonal balance of the acoustic signal is preserved as the desired volume signal changes. In this manner, a form of dynamic loudness control may be easily implemented.

The system may also include devices for generating a plurality of equalizer control signals. In this form, each gain control signal is generated by summing corresponding volume control, compression, and equalizer control signals.

In various forms, the noise signal may be generated by a microphone, a speedometer, or a memory such as a digital memory. In forms using a memory to generate the noise signal, a table of noise values is stored in the memory. Each noise value in the table corresponds to the noise, or the noise masking values, in the listening space corresponding to a set of conditions. In use, an address generator generates an address signal in response to a current set of conditions so that the address signal accesses the memory location storing the noise value corresponding to the current set of conditions. In automotive audio systems the conditions may include parameters such as the speed of the vehicle, the speed of the engine, the vibration of the vehicle, the position of the windows in the vehicle, the state of a climate control fan, the state of the windshield wiper, the state of the transmission, and the sound level in the vehicle. The system may include one or more sensors for generating a sensor signal representative of the current set of conditions in the listening space, and the address signal may be generated in response to the sensor signal. The memory may also generate a plurality of noise signals, each noise signal being associated with the noise in an associated frequency band.

The volume control device may also be implemented using a memory, such as a digital memory. In this form, a table of volume control values is stored in the memory, and each of the volume control values is representative of the volume control signal associated with a particular value of the desired volume and noise signals. An address generator generates an address signal from the current values of the desired volume and noise signals so that the address signal accesses the memory location containing the corresponding volume control value. Alternatively, the address generator may generate the address signal in response to a sensor signal representative of current noise conditions and the desired volume signal. Additionally, the memory may also store a table of compression setting values so that the memory may generate the volume control signal as well as the compression setting signal.

BRIEF DESCRIPTION OF DRAWINGS

The foregoing and other objects of this invention, the various features thereof, as well as the invention itself, may be more fully understood from the following description, when read together with the accompanying drawings in which.

Like numbered elements in each FIGURE represent the same or similar elements.

DESCRIPTION OF THE PREFERRED EMBODIMENTS

Figure 1:
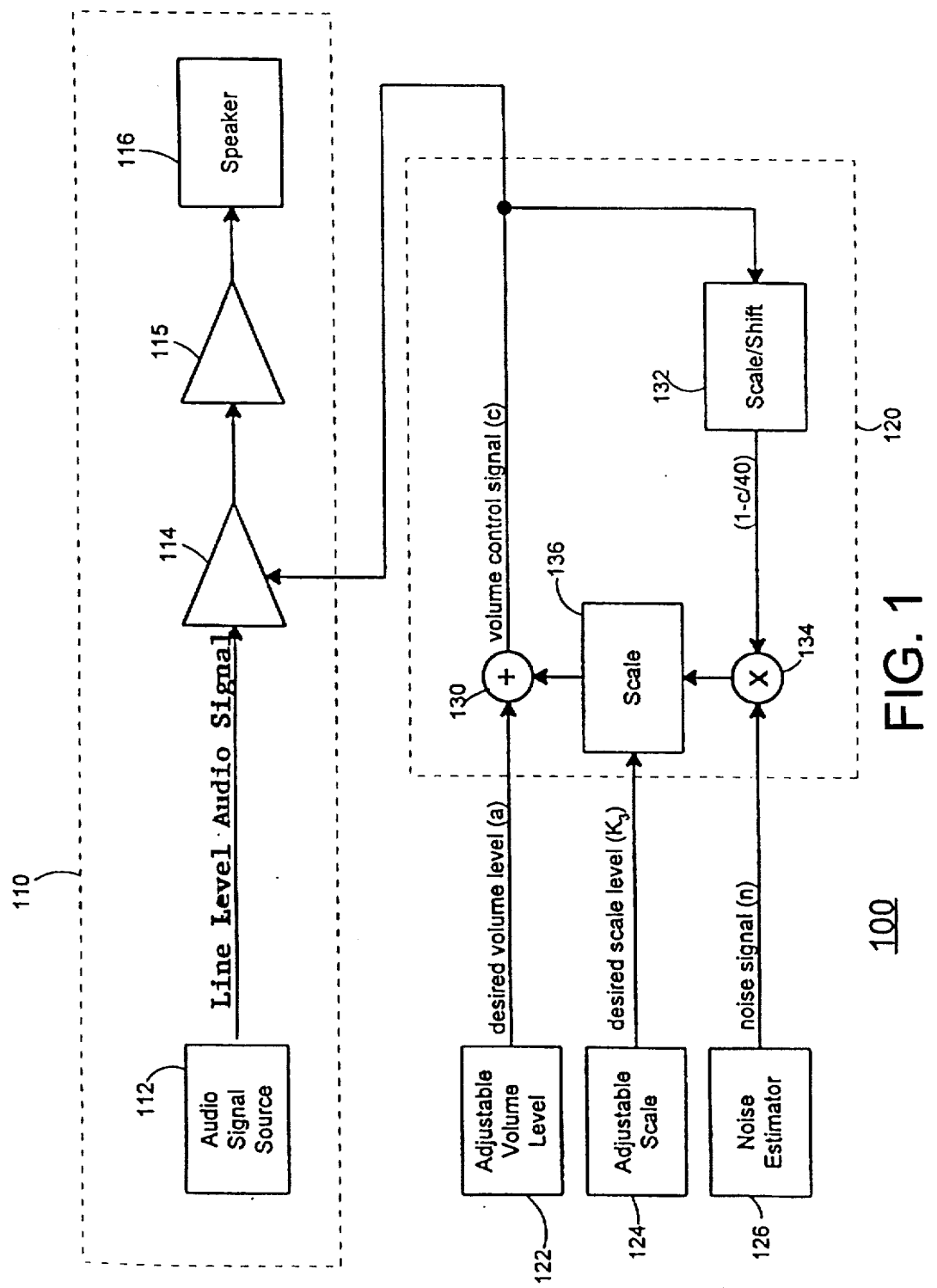
FIG. 1 is a block diagram of a single band audio signal processing system constructed according to the invention including a volume control subsystem.

FIG. 1 shows a block diagram of a single band automotive audio signal processing system 100 constructed according to the invention which generates acoustic signals in the passenger compartment of an automobile (not shown). System 100 provides a novel form of compensation for the apparent volume problem.

System 100 includes an amplification subsystem 110, a volume control subsystem 120, an adjustable volume level device 122, an adjustable scale device 124, and a noise estimator 126. Amplification subsystem 110 includes an audio signal source 112, a variable gain amplifier 114, a fixed gain amplifier 115, and a speaker system 116. Audio signal source 112, which may be implemented as a radio, a cassette tape player, a compact disc (CD) player, or the like, generates a line level audio signal (referred to hereinafter as the "line signal") which is applied to a signal input of amplifier 114. A volume control signal, which as will be discussed further below is generated by volume control subsystem 120, is applied to a gain control input of amplifier 114 so that the gain of amplifier 114 is controlled by the volume control signal. In general, the gain of amplifier 114 increases as the volume control signal increases. Amplifier 114 thus generates an amplified version of the line signal which is applied to fixed gain amplifier 115. The amplified output of fixed gain amplifier 115 is then applied to speaker system 116 which generates acoustic signals inside the passenger compartment of the automobile which are representative of the line signal. Amplifier 114 may be implemented as a voltage controlled amplifier, or other amplifier, and may be a linear or non-linear amplifier. Speaker system 116 includes one or more speakers mounted in the automobile. Fixed gain amplifier 115 is a well known audio signal power amplifier and in some forms of the invention, amplifier 115 may be eliminated so that the output of variable gain amplifier 114 is applied directly to speaker system 116.

Volume control subsystem 120 is a feedback type system which receives three input signals and generates from these inputs the volume control signal at its output. The input signals are a desired volume level signal, a desired scale level signal, and a noise signal. The volume control signal is also applied to an input of subsystem 120 by way of a feedback path and may be considered as a fourth input signal. The desired volume level signal is set by adjustable volume level device 122, which in one preferred embodiment is implemented using a potentiometer as is used in the standard volume control knob found in most audio reproduction systems. In this embodiment, the desired volume level signal is equivalent to a manually selected volume level signal. Similarly, the desired scale level signal is set by adjustable scale device 124, which may also be implemented using a potentiometer. The noise signal is representative of the ambient noise power level inside the passenger compartment of the automobile and is generated by noise estimator 126.

Subsystem 120 includes an adder 130, a scale/shifting device 132, a multiplier 134, and a scaling device 136. The desired volume level signal is applied to one input of adder 130, and the output of scaling device 136 is applied to the other input of adder 130. Adder 130 generates the volume control signal at its output by summing the signals present at its two inputs. The volume control signal is applied to the input of scale/shifting device 132 by way of a feedback path, and the output of scale/shifting device 132 is applied to one input of multiplier 134. The noise signal is applied to the other input of multiplier 134 which generates an output signal equal to the product of the signals at its two inputs. The output of multiplier 134 is applied to one input of scaling device 136 and the desired scale level signal is applied to the other input of scaling device 136.

Scale/shifting device 132 generates an output signal that is equal to the signal present at its input multiplied by a scale factor and shifted, so that if the input to device 132 is equal to 'c', the output of device 132 is equal to $[K_1-c/K_2]$. In one preferred embodiment, as shown in FIG. 1, $K_1$ equals one and $K_2$ equals forty, so for an input of 'c', device 132 generates an output signal equal to $[1-c/40]$.

Scale device 136 generates an output signal equal to the product of the signals at its two inputs. The desired scale level signal may be thought of as setting the value of a constant $K_3$ such that scale device 136 generates an output signal equal to the product of $K_3$ and the output signal generated by multiplier 134.

In operation, subsystem 120 generates the volume control signal according to the formula shown in Equation (2)

$$c = \left[a + nK_3\left(K_1 - \frac{c}{K_2}\right)\right] \quad (2)$$

in which 'c' is the volume control signal, 'a' is the desired volume level signal, and 'n' is the noise signal.

Figure 2:
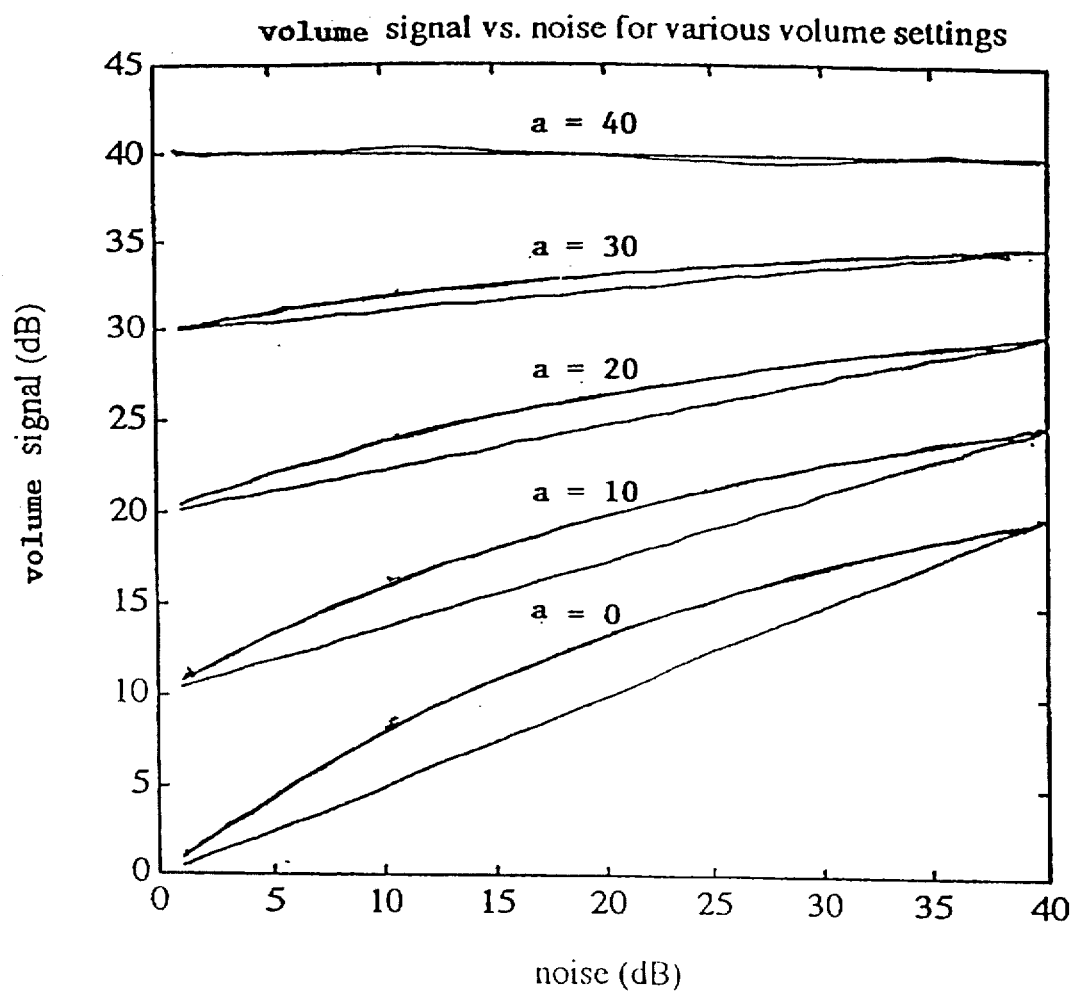
FIG. 2 is a graph comparing the volume control signal generated by the volume control subsystem shown in FIG. 1 and the volume control signal generated by a prior art system.

FIG. 2 shows five pairs of log-log curves. In each of the five pairs, the upper curve is the volume control signal generated by subsystem 120 for $K_1$ equal to one, $K_2$ equal to forty, and $K_3$ equal to one. The five upper curves shown are the volume control signal generated by subsystem 120 for five different values of the desired volume level signal 'a' (i.e., a=0, 10, 20, 30, and 40). For purposes of comparison, in each pair the lower curve (i.e., the linear log-log curve) is the gain control signal generated by the system described in the above-referenced U.S. Pat. No. 4,479,237 according to Equation (1) for $k_1$ equal to 0.5 and $k_2$ equal to eighty. While both systems vary the volume control signal by a relatively large amount in response to changing noise when the volume control signal is relatively small, and vary the volume control signal by a relatively small amount (or not at all) in response to changing noise when the volume control signal is relatively large, subsystem 120 considers the actual volume (i.e., the volume control signal) rather than just the manually adjusted volume level (i.e., the position of the volume control knob). Thus, subsystem 120 responds more aggressively to an increase in ambient noise when the volume control signal is relatively low, and as the volume control signal increases, subsystem 120 automatically responds less aggressively to increases in ambient noise.

In operation of system 100, a listener adjusts device 122 so that the acoustic signal has a desired volume. Thereafter, subsystem 120 automatically adjusts the volume control signal in response to the noise signal (which varies dynamically) to maintain the apparent volume at a desired level.

When scaling device 136 uses a scale factor of $K_3$ equal to unity, adder 130 adds the output signal of multiplier 134 to the desired volume level signal (which is set by the listener via device 122) to generate the volume control signal. The output signal of multiplier 134 varies to control the amount of boost provided to the volume control signal. The output signal of multiplier 134 varies as a function of the noise signal and the output signal of scale/shifting device 132 such that when the volume control signal is relatively small (and the output signal of scale/shifting device 132 is correspondingly large), the output signal of multiplier 134 varies significantly in response to changes in the noise signal and when the volume control signal is relatively large (and the output signal of scale/shifting device 132 is correspondingly small), the output signal of multiplier 134 varies only slightly in response to changes in the noise signal. So device 132 acts to modulate the degree to which the noise affects the volume control signal. The rate of change (or slope) of the output signal of device 134 is a function of the volume control signal, and as the volume control signal increases, this rate of change decreases, and as the volume control signal decreases, this rate of change increases. Similarly, the volume control signal changes in response to changes in the noise signal at a rate, and this rate decreases as the volume control signal increases, and this rate increases as the volume control signal decreases. So, the volume control signal responds aggressively to changes in the noise signal when the volume control signal is relatively small, and responds less aggressively to changes in the noise signal when the volume control signal is relatively large.

Preferably, scale/shifting device 132 is implemented with limiters (not shown) so that its output signal ranges between zero and unity. Preferably, the output signal of device 132 is zero when the volume control signal is at a level $VCS_{max}$, where this level causes system 100 to generate an acoustic signal that is at the maximum volume level that system 100 can produce without introducing distortion. This prevents the volume control signal from increasing in response to increasing noise when the acoustic signal is already at this maximum level. It may also be desirable for the output signal of device 132 to be zero even for levels of the volume control signal that are less than $VCS_{max}$ to prevent subsystem 120 from boosting the volume of already loud (although not maximally loud) signals.

Devices 124, 136 are provided so that a listener may control the degree to which subsystem 120 affects the volume control signal. In one embodiment, devices 124, 136 are implemented using a switch so that the scale factor $K_3$ is either zero or unity. A listener would set $K_3$ to zero to disable subsystem 120 and in this mode the volume control signal is entirely determined by the desired volume level signal. The listener would set $K_3$ to unity to enable subsystem 120. Alternatively, devices 124, 136 may be implemented using a potentiometer so that a listener may continuously vary the degree to which subsystem 120 affects the volume control signal. In other embodiments, subsystem 120 may be constructed without devices 124, 136 so that the output signal of multiplier 134 is applied directly to the input of adder 130. The signal added by adder 130 to the desired volume signal (e.g., the output of scaling device 134 or scaling device 136) to generate the volume control signal is referred to as the "volume control boost signal".

It may also be preferable to provide additional inputs to scale device 136 to provide additional flexibility in volume control subsystem 120. For example, it may be desirable to provide a connection between a speedometer (not shown) of the automobile and scale device 136 so that the constant $K_3$ is set to zero unless the automobile is traveling faster than a minimum speed threshold.

Figure 3:
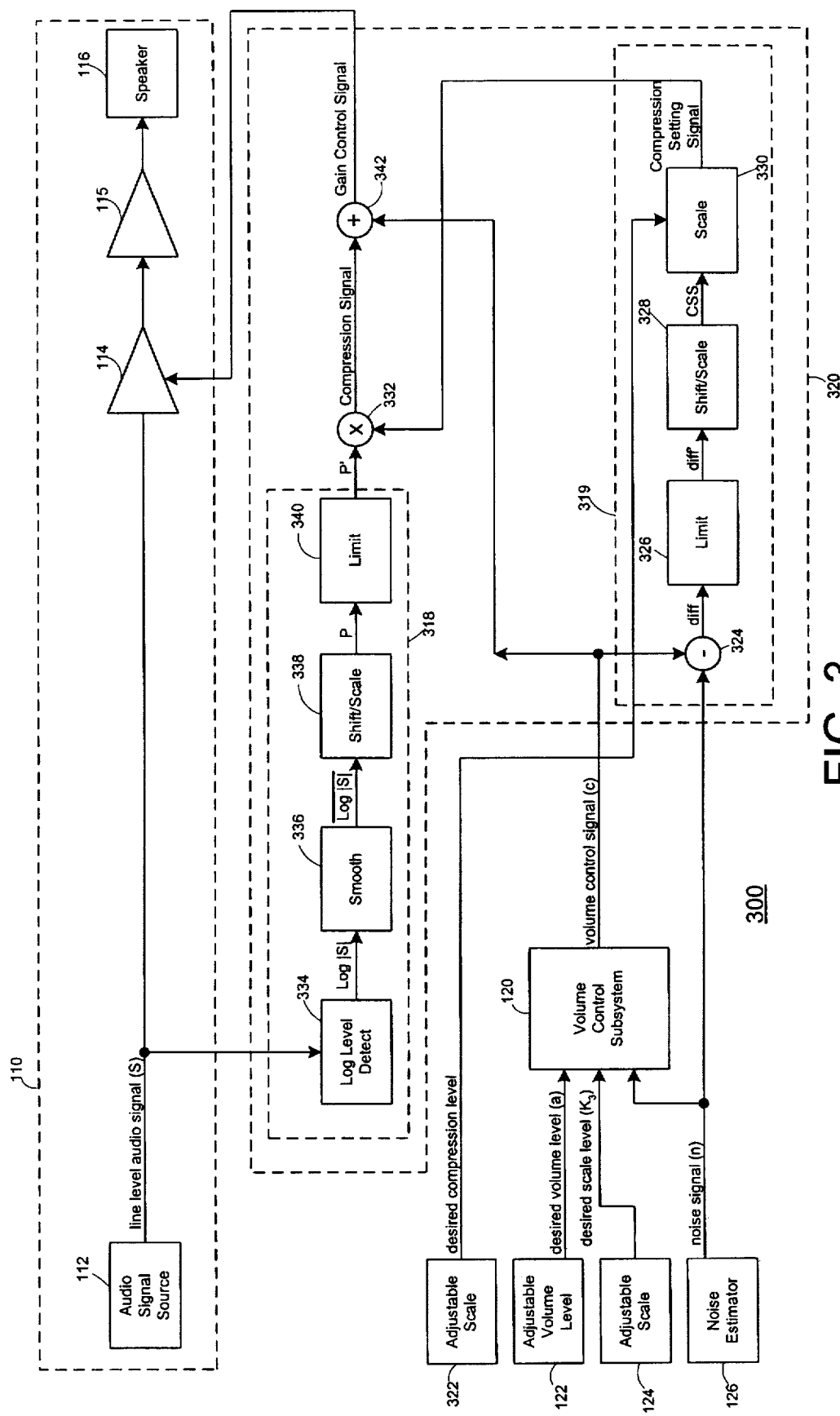
FIG. 3 is a block diagram of a single band audio signal processing system constructed according to the invention including a compression subsystem.

FIG. 3 shows a block diagram of a single band automotive audio signal processing system 300 constructed according to the invention. System 300 is similar to system 100 (shown in FIG. 1), however, system 300 additionally contains a compression subsystem 320 for automatically controlling the compression of the line signal. System 300 also includes an additional adjustable scale device 322. System 300 provides compensation for the apparent volume and dynamic range problems.

Compression subsystem 320 receives four inputs: the line signal generated by audio signal source 112, the volume control signal generated by subsystem 120, the noise signal generated by noise estimator 126, and a desired compression level signal generated by adjustable scale device 322. From these four inputs, compression subsystem 320 generates a compression signal and then sums this signal with the volume control signal to generate a gain control signal which is applied to the gain control input of amplifier 114.

Compression subsystem 320 includes a power signal subsystem 318, a compression setting subsystem 319, a multiplier 332, and an adder 342. Power signal subsystem 318 receives the line signal from audio signal source 112 as an input and generates from this input a power signal P' which as will be discussed further below is related to the instantaneous power level of the line signal. The power signal P' is applied to one input of multiplier 332. Compression setting subsystem 319 receives three inputs: the volume control signal, the noise signal, and the desired compression level signal and from these inputs generates a compression setting signal which is applied to the other input of multiplier 332. As will be discussed further below, the compression setting signal is related to the dynamic range between the maximally loud acoustic signal that system 300 will generate and the noise floor. Multiplier 332 generates the compression signal at its output by multiplying the P' signal and the compression setting signal. The compression signal is applied to one input of adder 342 and the volume control signal is applied to the other input of adder 342. Adder 342 sums the signals at its two inputs and generates at its output the gain control signal which is applied to the gain control input of amplifier 114.

The operation of power subsystem 318 and the generation of the power signal P' will now be discussed. Subsystem 318 includes a logarithmic level detector 334, a smoothing device 336, a shift/scaling device 338, and a limiter 340. The line signal generated by audio signal source 112 is applied to logarithmic level detector 334 the output of which is applied to the input of smoothing device 336. The output of smoothing device 336 is applied to the input of shift/scaling device 338 the output of which is applied to limiter 340. The output of limiter 340 is the power signal P'.

In operation, the logarithmic level detector 334 receives the line signal S generated by audio signal source 112 and preferably generates an output signal that is related to a logarithm of the absolute value of the line signal (i.e., Log |S|), although in other embodiments, the output signal may be related to the logarithm of the RMS value of the audio signal (i.e., Log $S_{RMS}$). This logarithmic signal is indicative of the instantaneous power of the line signal. The logarithmic signal is then smoothed by smoothing device, or filter, 336. The smoothed output of filter 336 (i.e., $\overline{Log|S|}$) is applied to shift/scaling device 338 which generates an output signal P according to the formula shown in Equation (3)

$$P = K_4(MAX - \overline{Log|S|}) \tag{3}$$

in which $K_4$ and MAX are constants, and $\overline{Log|S|}$ is the input to device 338. Preferably, the value of MAX is chosen in accordance with the maximum expected line signal power. If the maximum expected amplitude of the line signal from audio signal source 112 is the value max, then MAX is chosen to be equal to the output of smoother 336 corresponding to a line signal equal to max, so that when the line signal is at its maximum level the output of shift/scaling device 338 is zero (i.e., MAX minus $\overline{Log|S|}$ is zero). In general, the values of MAX and max (which are logarithmically related) may be empirically determined for any given audio signal source 112. The choice of the value for $K_4$ is a matter of convenience, and its selection will be discussed below.

The output signal P generated by device 338 is related to the difference between the maximum expected power of the line signal and the instantaneous power of the line signal. This signal P is applied to limiter 340 which generates the power signal P' at its output according to the formula shown in Equation (4)

$$P' = \begin{cases} P \text{ for } P < (MAX - MIN) & \text{(i.e. for } min < S) \\ 0 \text{ for } P > (MAX - MIN) & \text{(i.e., for } S < min) \end{cases} \tag{4}$$

in which MIN and min are constants. As with the choice of MAX, the choice of the values for MIN and min is related to the power of the line signal generated by audio signal source 112. If the minimum expected power of the line signal is equal to min (so that any signal less than min represents only noise or intended silence), then MIN is chosen to be the output of shift/scaling device 338 corresponding to a line signal equal to min. Again, the values of min and MIN may be empirically determined for any audio signal source 112.

Figure 4A:
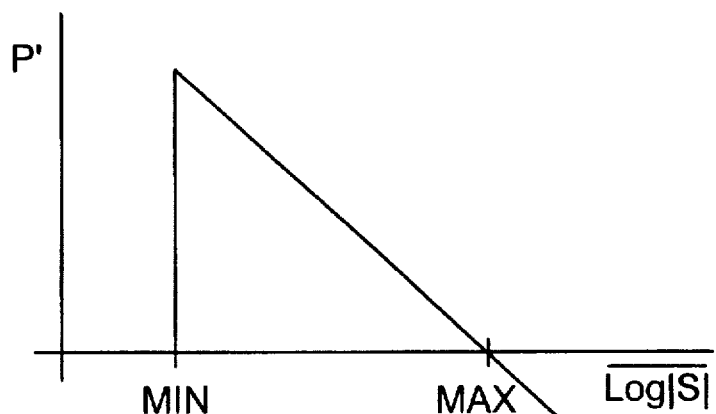
FIGS. 4A–C are graphs showing different forms of the power signal which may be generated by the compression subsystem shown in FIG. 3.

FIG. 4A shows a graph of the power signal P' generated by limiter 340 versus the smoothed logarithm signal from smoother 336. The power signal P' is applied to one input of multiplier 332 and is therefore one of the factors used to generate the compression signal. FIG. 4A illustrates that the value of P' is zero when the instantaneous power of the line signal equals its maximum expected value. This is useful because zero boost is desired when the instantaneous power is very large (i.e., S=max); this prevents very loud passages from being made louder. As the instantaneous power level drops (as during soft passages of music), P' increases so that low level signals are boosted by compression subsystem 320. Finally, if the instantaneous power level drops so that the line signal S is less than min, as during program pauses, the signal P' becomes zero, so that these undesired signals are not boosted by the compression system. In this manner compression subsystem 320 provides a signal P' which varies smoothly, preferably with constant slope in dB, when the line signal level is greater than min, and which is zero when the line signal level is less than min. This provides a smooth degree of compression of the desired signals and at the same time prevents the boosting of undesired soft signals such as program pauses.

Since the signal P' is greater than zero for line signal levels slightly smaller than max, compression subsystem 320 provides a volume boost to these already loud signals. If such a volume boost of already loud signals is not desired, the value of max may be selected to be smaller than the maximum expected line signal power level. It may even be preferable to set max equal to the average power level of the line signal so that only passages below the average power level receive a volume boost from compression subsystem 320.

Figure 4B:
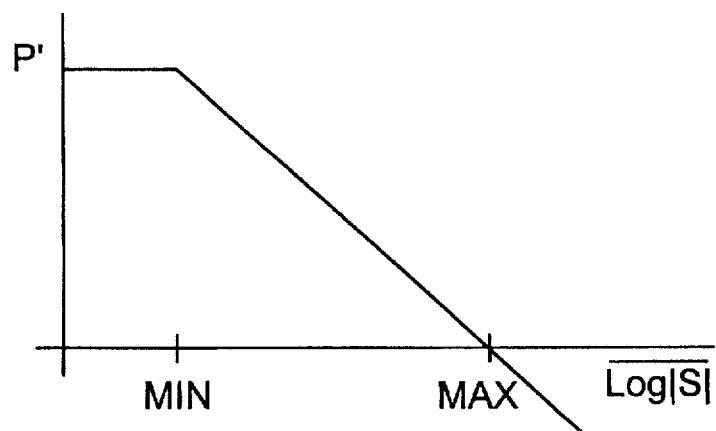
Figure 4C:
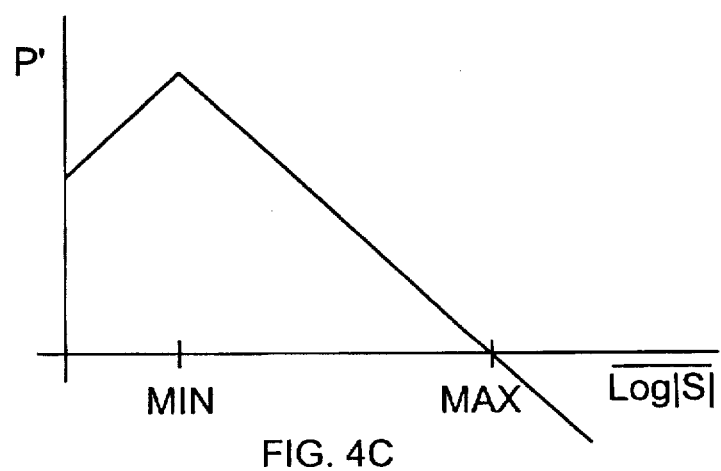

FIGS. 4B and 4C are graphs of alternative forms of the power signal P' which may be produced by subsystem 318. While the form shown in FIG. 4A is preferable, the forms shown in FIGS. 4B and 4C will also provide improved performance. As those skilled in the art will appreciate, the power signal P' may be generated by subsystem 318 as illustrated in FIG. 3, or alternatively, the power signal P' may be generated by a prior art compression system.

While the signal P' is related to the instantaneous power level of the line signal, the other factor used to generate the compression signal (i.e., the compression setting signal) is related to the difference between the maximum anticipated acoustic power produced by the sound reproduction system (as indicated by the volume control signal) and the noise power level. The operation of compression setting subsystem 319 and the generation of the compression setting signal will now be discussed.

Compression setting subsystem 319 includes a subtractor 324, a limiter 326, a shift/scaling device 328, and a scaling device 330. Subtractor 324 receives as inputs the volume control signal and the noise signal and generates an output signal equal to the volume control signal minus the noise signal. The output of subtractor 324 is applied to an input of limiter 326 the output of which is applied to the input of shift/scaling device 328. The output of shift/scaling device 328 is applied to one input of scaling device 330, and the desired compression level signal is applied to the other input of scaling device 330. The output of scaling device 330 is the compression setting signal and is applied to one input of multiplier 332.

Subtractor 324 generates an output signal diff equal to the volume control signal minus the noise signal. As will be discussed further below, the volume control signal is representative of the maximum acoustic signal that system 300 will generate. This signal diff is then representative of the range in which system 300 will generate the acoustic signal. For example, if the maximum acoustic signal that system 300 will generate is 70 dB and the noise power level inside the vehicle is 25 dB, then system 300 has 45 dB (i.e., 70-25) in which to generate the acoustic signal so that all of the acoustic signal is above the noise floor. For this example then, the signal diff is representative of 45 dB.

The diff signal is applied to limiter 326 which generates an output signal diff' that is equal to the diff signal when the diff signal is greater than a predetermined minimum level and is equal to the predetermined minimum level when the diff signal is less than this level. The limiter thus limits the diff' signal and prevents subsystem 320 from providing excessive compression. The limiter also limits the diff' signal so that it is set to a predetermined threshold value when the diff signal equals or exceeds this threshold. This prevents subsystem 320 from acting as a dynamic range expander in the case of very large diff signals. The output diff' of limiter 326 is applied to shift/scaling device 328 which generates an output signal CSS according to Equation (5)

$$CSS = K_6(K_5 - diff')$$ (5)

in which $K_5$ and $K_6$ are constants. The CSS signal is then applied to the input of scaling device 330, which in conjunction with device 322 scales the CSS signal by a factor $K_7$ to generate the compression setting signal.

The value of the compression setting signal is determined in part by the values of the constants $K_4$, $K_5$, $K_6$, and $K_7$. In one preferred embodiment, the constant $K_4$ is chosen to be representative of 1/GAIN where GAIN is the gain of amplifier 114 (i.e., if the gain of amplifier 114 is 20 dB/V so that amplifier 114 increases its output by 20 dB for every increase of one volt in the gain control signal, then $K_4$ is chosen to be 0.05), the constant $K_5$ is chosen to be representative of the dynamic range of the uncompressed audio signal (i.e., the dynamic range of the audio signal that it is desired to preserve), the constant $K_6$ is chosen to be representative of the quantity [1/(MAX-MIN)], and the constant $K_7$ is a listener controlled constant which may range between zero and unity, although as those skilled in the art will appreciate, there is a relatively large degree of flexibility in the choice of these constants.

The previous example, in which the maximum signal that system 300 will generate is 70 dB, and the noise power is 25 dB, will now be discussed for this choice of the constants. It is important to note that while many audio signal sources 112 have the capability of producing an audio signal with a dynamic range of 100 dB, the dynamic range of most audio signals is typically about 40 to 60 dB. If the dynamic range of the uncompressed audio signal is 60 dB then the constant $K_5$ is chosen to be representative of 60 dB, and the quantity $K_5$ minus diff' (which is used in Equation (5) to calculate the CSS signal) is representative of 15 dB (i.e., 60 dB minus 45 dB). This is the amount by which it is desired to boost the lowest amplitude portions of the audio signal, i.e., the lowest amplitude portions of the uncompressed signal are at 10 dB (70-60) and since the noise floor is at 25 dB the lowest amplitude portion is preferably boosted by 15 dB to bring it up to the noise floor. The CSS signal is then a voltage representative of $K_6$15 dB (or 15 dB/[MAX-MIN]), and assuming that $K_7$ is equal to unity, the compression setting signal equals the CSS signal. When the line signal is at its minimum amplitude portions, the power signal P' is a voltage representative of the quantity $K_4$(MAX-MIN) or (MAX-MIN)/GAIN. Since the compression signal is the product of the CSS signal and the power signal P', when the line signal is at its minimum amplitude portions, the compression signal is a voltage representative of the quantity $K_4$15 dB, or (15 dB)/GAIN. This signal applied to the gain control input of amplifier 114 will yield the desired 15 dB of boost for the minimum portions of the audio signal.

As those skilled in the art will appreciate, other values of the constants, as well as other forms of compression setting subsystem 319 which generate the compression setting signal according to a function of the dynamic range between the maximally loud signal that system 300 will generate and the noise level will also function well with the invention.

If the noise remains constant, the compression setting signal will remain constant, however, the compression signal continues to vary dynamically as a function of the line signal power level (i.e., according to the power signal P') so that the compression signal is at its maximum value when the line signal is at its minimum power level and the compression signal is zero when the line signal is at its maximum power level.

The constant $K_7$ is controlled by devices 322, 330 which operate in a similar fashion as devices 124, 136 (discussed above in connection with FIG. 1) and allow a listener to control the degree to which compression subsystem 320 affects the compression of the audio signal. Devices 322, 330 may be implemented as a switch so that a listener may set $K_7$ to either zero (to disable subsystem 320) or to unity (to enable subsystem 320). Alternatively, devices 322, 330 may be implemented as a potentiometer so a listener may smoothly vary $K_7$ to smoothly control the degree to which subsystem 320 affects the compression of the audio signal. Also, devices 322, 330 may be implemented using a switch and a potentiometer so that in one mode a listener may directly control the amplitude of the compression setting signal (i.e., by varying the potentiometer) and in another mode compression subsystem 320 determines the compression setting signal. Further, devices 322, 330 may be entirely eliminated in which case the output of shift/scaling device 328 is the compression setting signal and is applied directly to the input of multiplier 332.

As was stated above, the volume control signal is representative of the maximum acoustic signal that system 300 will generate. This is true because the compression signal is zero when the line signal is at its maximum power (since the signal P' is zero for this condition). So for the maximum power line signal, the gain control signal is equal to the volume control signal, so the volume control signal is therefore representative of the maximum acoustic signal that system 300 will generate. The compression signal only contributes to the gain control signal in the lower volume ranges which is where compression is desired.

Preferably, the volume control signal may also determine the minimum acoustic signal that system 300 will generate so that a listener may completely "turn off" or "silence" system 300 by setting the desired volume level signal to a minimum value. Preferably, the minimum setting of the desired volume level signal produces a volume control signal that has a large negative value so that the gain control signal generated by adder 342 is dominated by the negative volume control signal even when the compression signal is at its maximum value. Preferably, the gain control signal generated when the desired volume level signal is at its minimum setting effectively "nulls" or "shuts off" amplifier 114.

It may be desirable to scale and/or shift the volume control signal prior to applying it to subtractor 324 (which generates the diff signal) to insure that the signal applied to subtractor 324 is properly calibrated with the noise signal and with the volume level (or sound pressure level) produced in the automobile in response to the volume control signal. It may also be preferable to adjust subtractor 324 so that the output signal diff is representative of a number slightly larger than the difference between the volume control signal and the noise signal. This allows system 300 to generate portions of the acoustic signal at a power level below the noise level, which is sometimes preferable to avoid overly compressing the acoustic signal.

It may be preferable for filter 336 of power subsystem 318 to have two different time constants so that the output of filter 336 tracks increases in the audio signal relatively quickly, and tracks decreases in the audio signal more slowly. This is so that as the line signal power increases, subsystem 320 rapidly reduces the compression signal to avoid generating excessively loud acoustic signals, and so that as the line signal power decreases, subsystem 320 provides a slowly increasing amount of boost. In one embodiment, filter 336 is implemented using two filters the outputs of which are combined so that one filter is used when the audio signal is increasing and the other filter is used when the audio signal is decreasing. In one preferred embodiment, filter 336 is constructed so that the output signal generated by filter 336 tracks increases in the input signal applied to filter 336 [i.e., Log|S|] within a few (i.e., not more than ten) milliseconds, and tracks decreases in the input signal within several hundred milliseconds.

Figure 5:
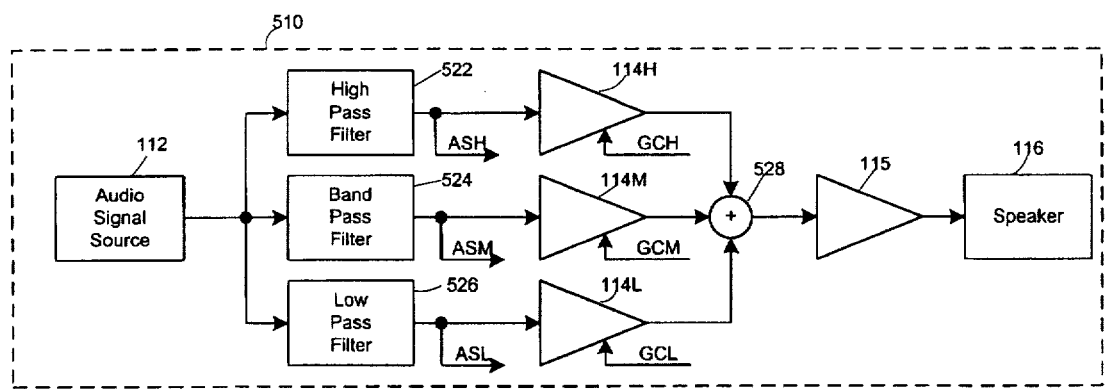
FIG. 5 is a block diagram of a multi-band audio signal processing system constructed according to the invention.
Figure 5:
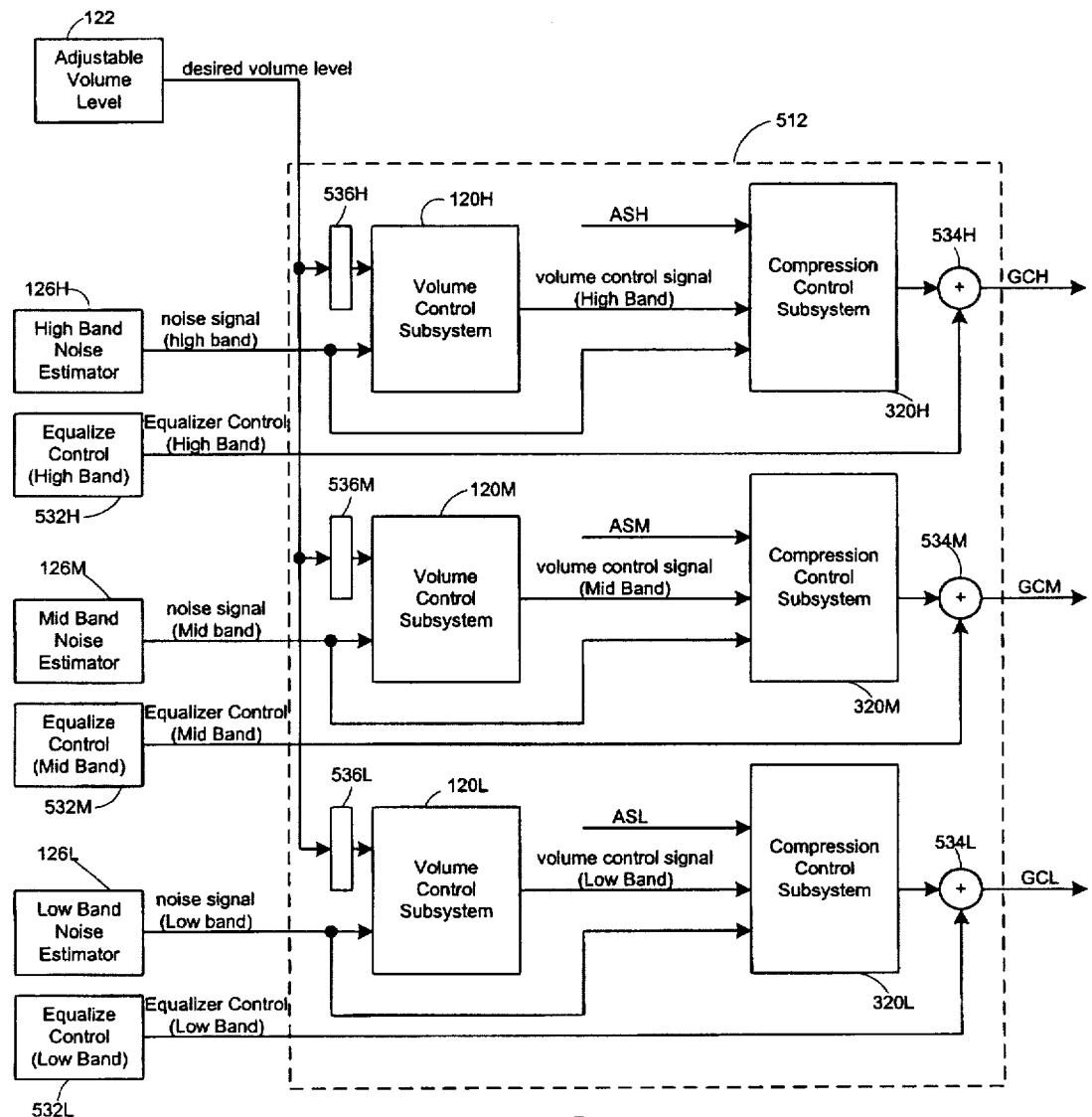

FIG. 5 shows a block diagram of a multi-band automotive audio signal processing system 500 constructed according to the invention. System 500 is similar to system 300 (shown in FIG. 3), however, system 500 additionally contains components for dividing the audio signal into separate frequency bands and for computing a gain control signal for each band. System 500 thereby provides compensation for the apparent volume, uneven masking and dynamic range problems. System 500 as shown divides the audio signal into three separate bands, a high band, a middle band, and a low band, and processes each band separately. Those skilled in the art will appreciate that system 500 is exemplary of a system which may divide the audio signal into any number of bands.

System 500 includes an amplification subsystem 510 and a gain control subsystem 512. Amplification subsystem 510 is similar to subsystem 110 (discussed in connection with FIG. 1) however, subsystem 510 includes components for dividing the audio signal into three separate frequency bands, a low frequency band, a medium frequency band, and a high frequency band. Specifically, subsystem 510 includes three filters, a high pass filter 522, a band pass filter 524, and a low pass filter 526, and rather than a single variable gain amplifier, subsystem 510 includes three variable gain amplifiers 114H, 114M, and 114L.

The audio signal generated by audio signal source 112 is applied to the inputs of the three filters 522, 524, 526, and in response high pass filter 522 generates a high band audio signal ASH, band pass filter 524 generates a mid-band audio signal ASM, and low pass filter 526 generates a low band audio signal ASL. The three filtered audio signals, ASH, ASM, and ASL, are applied to the respective signal inputs of the three variable gain amplifiers 114H, 114M, and 114L. The three variable gain amplifiers 114H, 114M, 114L, amplify their respective signal inputs in accordance with three gain control signals which are generated by gain control subsystem 512, so that amplifier 114H amplifies the ASH signal in accordance with a high band gain control signal GCH, amplifier 114M amplifies the ASM signal in accordance with a mid-band gain control signal GCM, and amplifier 114L amplifies the ASL signal in accordance with a low band gain control signal GCL. The amplified outputs of amplifiers 114H, 114M, and 114L are summed by a summer 528 the output of which is applied to fixed gain amplifier 115.

Gain control subsystem 512 receives as inputs three noise signals, a high frequency band noise signal, a medium frequency band noise signal, and a low frequency band noise signal, representative of the high, medium, and low frequency noise, respectively, in the automobile. In system 500, these signals are provided by a high band noise estimator 126H, a medium band noise estimator 126M, and a low band noise estimator 126L. Subsystem 512 also receives as inputs high band, medium band, and low band equalizer control signals which are generated by devices 532H, 532M, and 532L, respectively. Subsystem 512 further receives as inputs the desired volume level signal and the three audio signals ASH, ASM, ASL, and from these inputs, subsystem 512 generates the three gain control signals GCH, GCM, and GCL.

Gain control subsystem 512 includes three volume control subsystems 120H, 120M, 120L, three compression subsystems 320H, 320M, 320L, three adders 534H, 534M, 534L, and three scaling devices 536H, 536M, 536L. Subsystems 120H, 320H, adder 534H, and scaling device 536H form a high band channel of subsystem 512. Similarly, subsystems 120M, 320M, adder 534M, and scaling device 536M form a medium band channel, and finally, subsystems 120L, 320L, adder 534L, and scaling device 536L form a low band channel. The desired volume level signal is applied to the three scaling devices 536H, 536M, 536L, each of which generates an output signal by scaling the desired volume level signal by a constant. The three output signals generated by scaling devices 536H, 536M, 536L are applied to the respective inputs of the three volume control subsystems 120H, 120M, 120L. The high band noise signal is applied to the high band volume control and compression subsystems 120H and 320H, the medium band noise signal is applied to the medium band subsystems 120M and 320M, and the low band noise signal is applied to the low band subsystems 120L and 320L. The high band audio signal ASH is applied to the compression subsystem 320H, the mid-band audio signal ASM is applied to the compression subsystem 320M, and the low band audio signal ASL is applied to the compression subsystem 320L. High band volume control subsystem 120H generates a high band volume control signal which is applied to high band compression subsystem 320H. Similarly, subsystem 120M generates a medium band volume control signal which is applied to subsystem 320M, and subsystem 120L generates a low band volume control signal which is applied to subsystem 320L. The volume control subsystems and compression subsystems operate substantially as described in connection with FIGS. 1 and 3, however each subsystem operates on only one frequency band.

The gain control signals generated by subsystems 320H, 320M, 320L, are each applied to a respective input of the three adders 534H, 534M, 534L. The high range equalizer control signal is applied to the other input of adder 534H, the mid range equalizer control signal is applied to the other input of adder 534M, and the low range equalizer control signal is applied to the other input of adder 534L. The three adders 534H, 534M, 534L, each sum their two respective input signals to generate respectively the three gain control signals GCH, GCM, and GCL, which are applied to the respective variable gain amplifiers 114H, 114M, and 114L.

As is well known, the frequency response of the human auditory system varies at different volume levels. Specifically, the response at the low frequency and high frequency ends of the audible spectrum decreases in comparison to the mid-range frequency response as the volume level decreases. (See for example Robinson, D. W. and Dadson, R. S., "A Re-Determination of the Equal-Loudness Relations for Pure Tones." British Journal of Applied Physics, Vol. 7, 1956, pp. 166–181). This results in a problem such that the perceived tonal balance of an acoustic signal fluctuates significantly with changes in volume level. The scaling devices 536H, 536M, 536L which may be included in system 500 offer a method of compensating for this problem. Each of the scaling devices 536H, 536M, 536L preferably generates its output signal by scaling the desired volume level signal by a different constant. The three constants are chosen so that the output of each scaling device varies differently as the desired volume level (i.e., volume knob position) changes. The scaling constants for the low and high frequency bands are smaller than that for the medium-frequency band, so that as the desired volume level decreases (i.e., if the user turns the volume down), the low and high frequency band signals are attenuated less than the medium frequency band signals. In this manner a form of dynamic loudness control may be simply and easily implemented, preserving the perceived tonal balance of the desired audio signal at different volume levels. In other forms, however, system 500 may be constructed without scaling devices 536H, 536M, 536L and the desired volume level signal is applied directly to the volume control subsystems 120H, 120M, 120L.

For convenience, adjustable scale devices 124, 322 are not shown in system 500, however, these devices may also be included. A single device 124 may be provided so that a listener may tune all three volume control subsystems with one adjustment, or three devices may be provided so that a listener may individually adjust each volume control subsystem. The same is true for device 322 and the three compression subsystems.

Equalizer control devices 532H, 532M, 532L allow a listener to adjust the equalizer control signals and thereby selectively, independently, boost or attenuate the three gain control signals GCH, GCM, GCL, preferably by at least plus or minus 12 to 15 dB. Equalizer control devices 532H, 532M, 532L, thereby provide for listener controlled adjustment of the tonal balance of the acoustic signal generated by speaker system 116. In other embodiments, inputs to the volume control subsystems 120H, 120M, 120L, may be generated by summing the desired volume level signals (e.g., the outputs of scaling devices 536H, 536M, 536L) with the equalizer control signals (i.e., the output of devices 532H, 532M, 532L). In these embodiments, the compression subsystems 320H, 320M, 320L generate the gain control signals, GCH, GCM, GCL, directly (so it is of course unnecessary to sum the outputs of the compression subsystems with the equalizer control signals), and in these embodiments the volume control and compression subsystems operate directly on the equalized signals.

In system 500, each volume control subsystem automatically generates a volume control signal for its frequency band in response to the desired volume level and noise level in its band. Similarly, each compression subsystem automatically generates a compression signal for its frequency band in response to the noise, audio, and volume control signals in its band. So system 500 generates an optimum amount of volume boost and compression in each frequency band in response to the dynamically varying conditions of each band.

The division of the audio signal into a plurality of frequency bands offers several additional advantages. First, it provides for a simple implementation of a user-controlled equalizer (e.g., using equalizer control devices 534H, 534M, 534L). Second, it provides the ability to compensate for non-uniform frequency response of the audio reproduction system since biases may easily be applied to the equalizer control signals. Third, it allows a simple implementation of dynamic loudness control through use of scaling devices, 536H, 536M, and 536L as described above. Further, it improves the dynamic range compression in two ways. First, the compression setting signals of each band may be generated independently and therefore may be set to the most appropriate value for each band. (E.g., if there is no masking noise in a given frequency band it may not be desirable to compress signals in that band, while it may be desirable to compress signals in other bands which contain masking noise.) Second, the division of the audio signal into a plurality of frequency bands allows for a greater degree of compression to be achieved than that which is possible in single-band systems. In single-band systems, the instantaneous power of the line signal is estimated for the entire frequency bandwidth of the acoustic signal. Thus as the line signal power increases the compression signal decreases and the volume boost is reduced. However, there is a problem with this single-band method such that sounds of different frequencies may audibly modulate one another. If, for example, a passage contains low frequency sounds from a single cello, a single-band system will calculate the representative line signal power of these sounds and generate a corresponding compression signal and a corresponding volume boost. If, however, higher frequency sounds from a flute are added to the acoustic signal, the single-band system will register that the line signal power has increased and will lower the compression signal and volume boost accordingly. When the degree of compression is high, the flute may be heard to lower the volume level of the cello; this is unpleasant and usually prevents very high degrees of compression from being utilized. If, however, the audio signal is divided into a plurality of frequency bands with compression carried out independently in each band, the degree of compression may be significantly increased. In system 500 the instantaneous power is estimated for each band separately, thus preventing sounds of one band from modulating those of another. In the case of extremely noisy listening environments where a large degree of compression is needed, a multi-band system thus represents a considerable improvement.

Figure 6A:
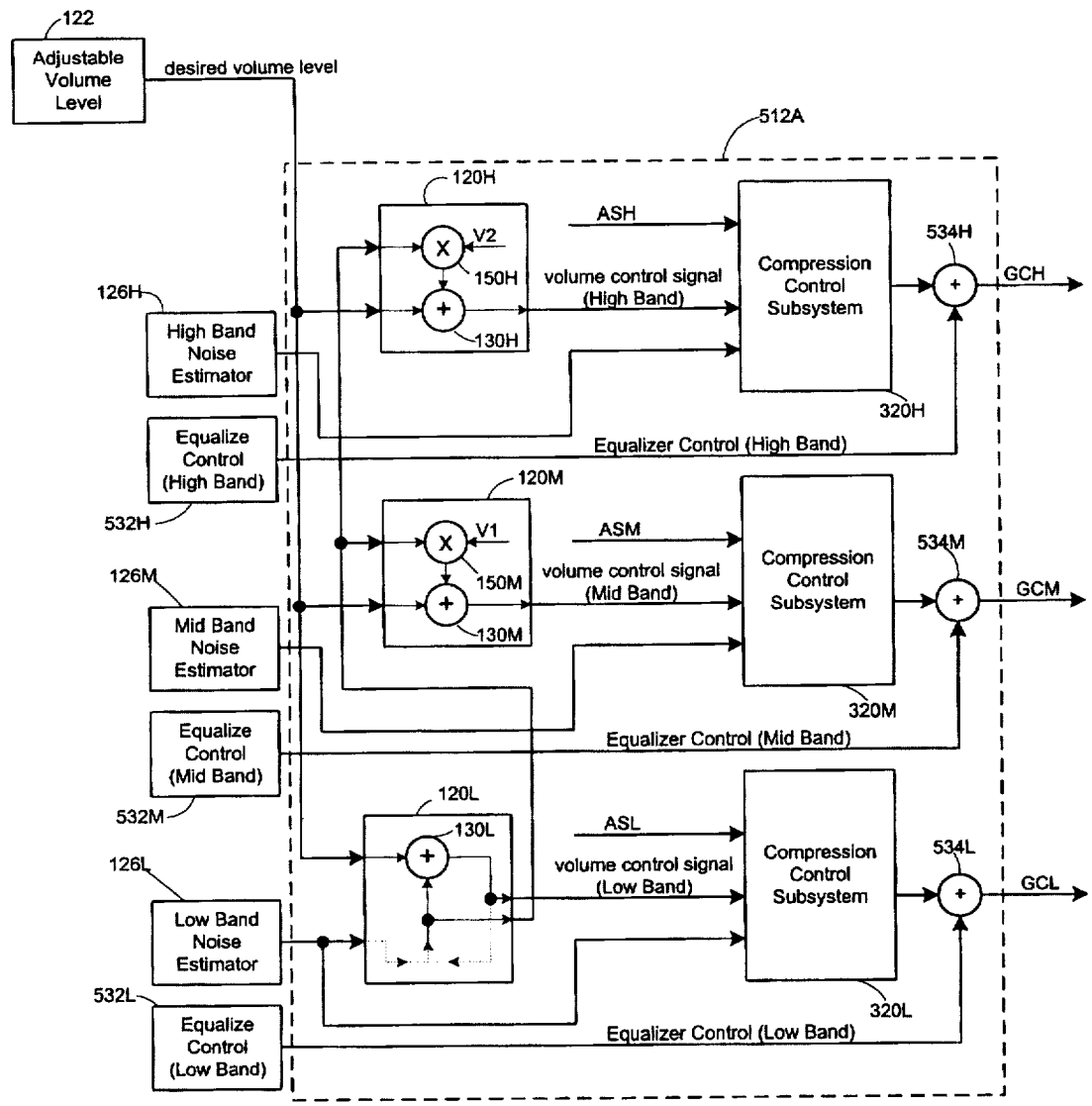
FIGS. 6A–C are block diagrams of simplified versions of the gain control subsystem shown in FIG. 5.

As has been described, each volume control subsystem in subsystem 512 is constructed similarly to subsystem 120 discussed in connection with FIG. 1, and each compression control subsystem in subsystem 512 is constructed similarly to subsystem 320 discussed in connection with FIG. 3. However, the invention also provides other simpler forms of subsystem 512. FIG. 6A shows a block diagram of one such simplified subsystem 512A, in which the medium band volume control subsystem 120M is simply implemented using a scaling device 150M and adder 130M, and the high band volume control subsystem 120H is implemented in a similar fashion. Only low band volume control subsystem 120L is implemented similarly to subsystem 120 as shown in FIG. 1. Scaling device 150M scales the low band volume control boost signal (which sets the amount of boost that is added to the desired volume signal by adder 130L to generate the low band volume control signal, e.g., the output of scaling device 136L (not shown) or 134L (not shown)) by a constant V1 to generate the medium band volume control boost signal, which is then added to the desired volume signal by adder 130M to generate the medium band volume control signal. Similarly, scaling device 150H scales the low band volume control boost signal by a constant V2 to generate the high band volume control boost signal. Since most of the ambient noise in an automobile is in the lower frequency band, subsystem 512A generates the medium and high band volume control signals so that the desired volume boost in the higher frequency bands compensates for the noise masking effects of the low frequency noise in the higher frequency bands (since as is well known, and as will be discussed further below, noise at one frequency may mask an acoustic signal both above and below that frequency), and also for any noise which may be present in the higher bands. The constants V1 and V2 may be determined empirically and preferably range between zero and one, although they may alternatively be even greater than one. In other forms, the low band volume control boost signal is generated as a scaled version of one of the higher band volume control boost signals.

Figure 6B:
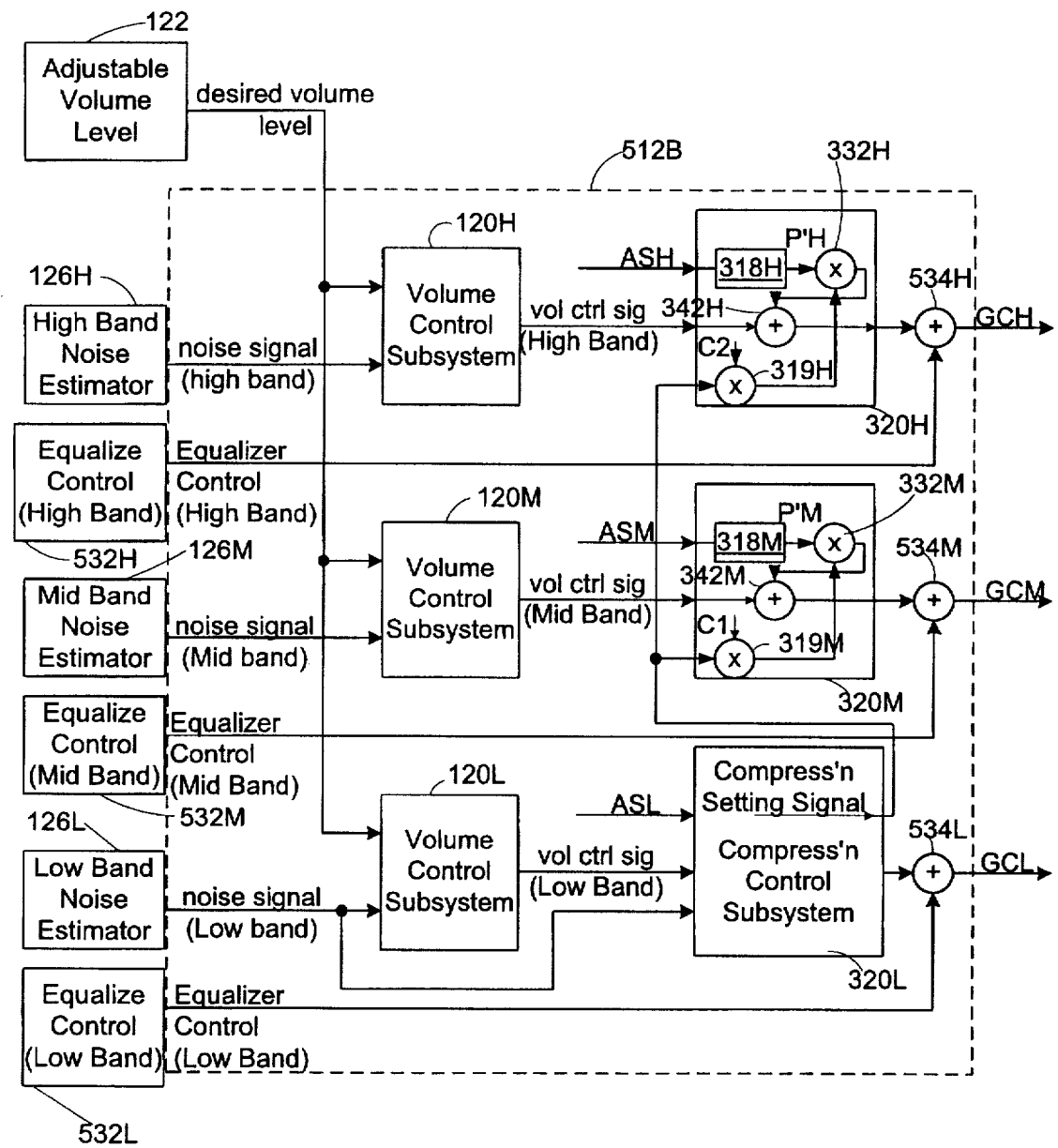
Figure 6C:
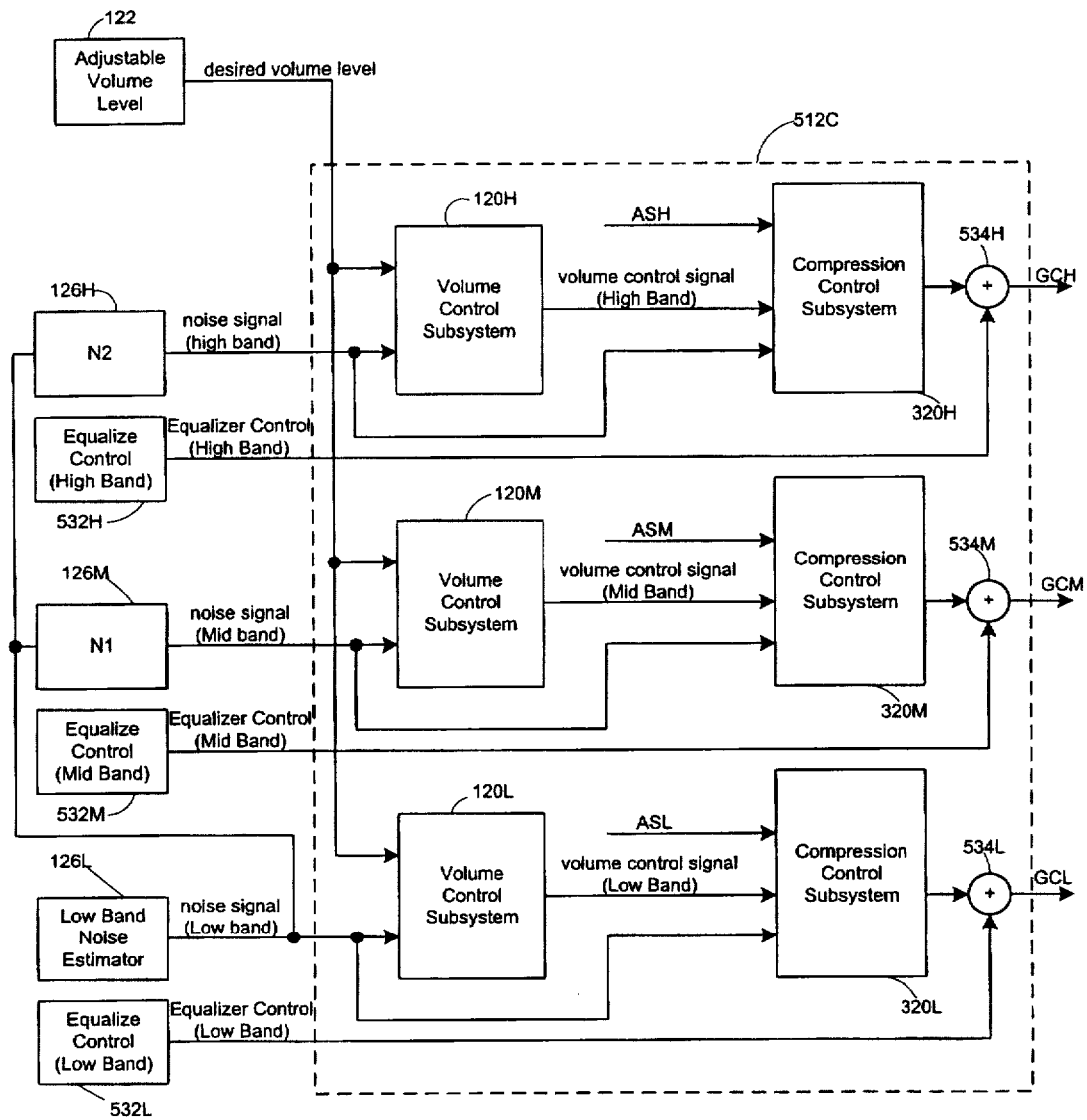

FIG. 6B is a block diagram of a subsystem 512B which is another simplified version of subsystem 512. In subsystem 512B, only the low band compression subsystem 320L functions similarly to subsystem 320. In medium and high band subsystems 320M, 320H, each of the compression setting subsystems 319M, 319H are implemented simply as a multiplier so that the medium band compression setting signal is generated by multiplying the low band compression setting signal by a constant C1 and the high band compression setting signal is generated by multiplying the low band compression setting signal by a constant C2. FIG. 6C is a block diagram of a subsystem 512C which is yet another simplified version of subsystem 512. In subsystem 512C, the medium and high band noise estimators 126M, 126H are implemented simply as multipliers, and the medium band noise signal is generated by multiplying the low band noise signal by a constant N1, and the high band noise signal is generated by multiplying the low band noise signal by a constant N2. As with V1 and V2, the constants C1, C2, N1, and N2 may be empirically determined. Those skilled in the art will appreciate that the invention further includes combinations of subsystems 512, 512A, 512B, and 512C. For example, in one such subsystem, the high and medium band noise estimators 126M, 126H are implemented simply as multipliers, and the high and medium band volume control subsystems 120H, 120M are implemented in the simplified form shown in FIG. 6A. In another such subsystem, the low band noise signal is generated by multiplying the high band noise signal by a constant which may be empirically determined, or the low band compression setting signal may be generated as a scaled version of one of the higher band signals. Further, the simplified subsystems may also include scaling devices 536H, 536M, 536L for preserving tonal balance.

In all audio signal processing systems according to the invention, the noise signals may be provided by any form of prior art noise estimator, for example by a noise estimating system using a microphone or a filter. One form of system 500 includes three such estimators, each tuned to generate a noise signal representative of the noise in a particular band. In preferred audio signal processing systems, the noise signals are provided by noise subsystems constructed according to the invention using digital memories.

Figure 7:
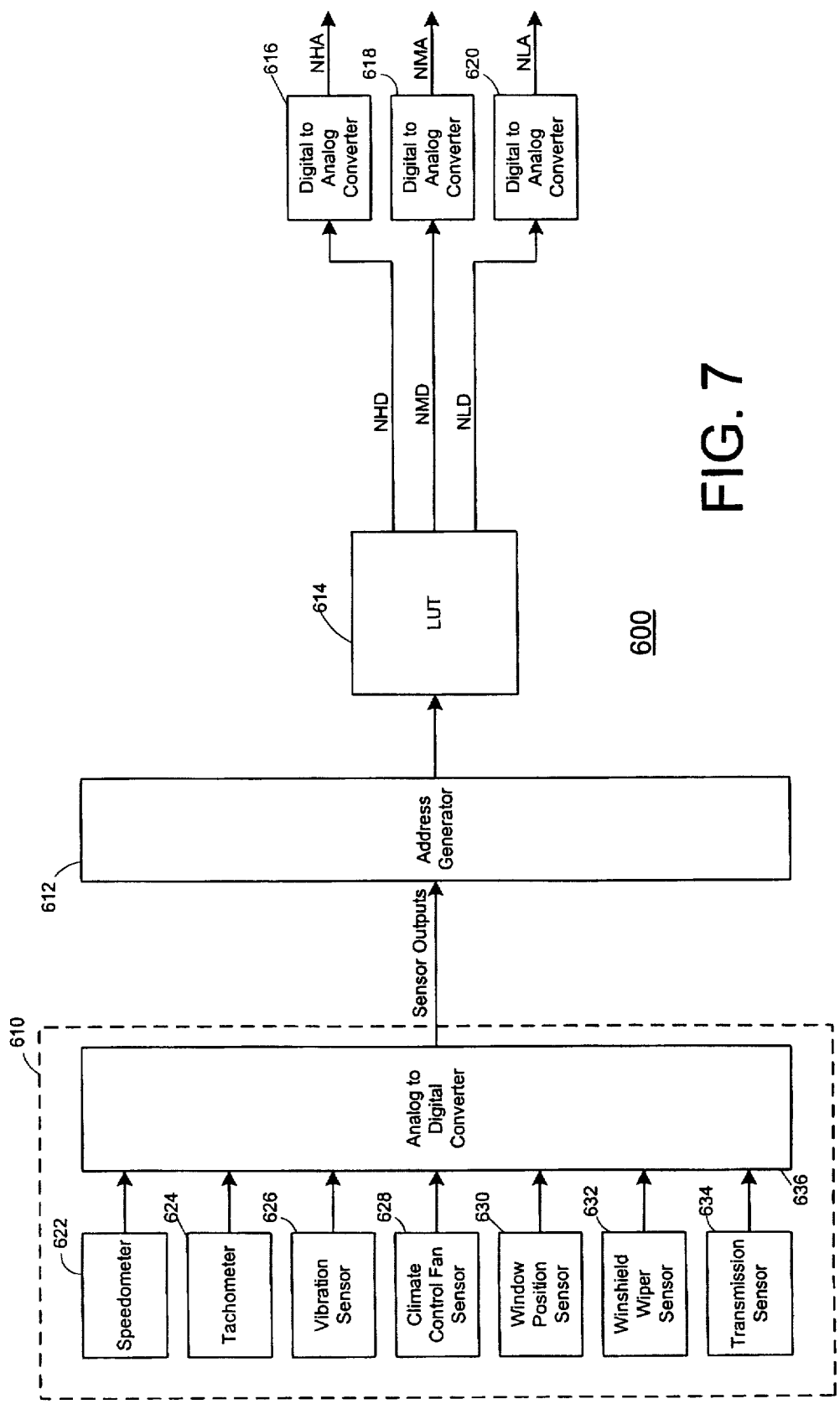
FIG. 7 is a block diagram of a noise estimation subsystem constructed according to the invention.

FIG. 7 shows a block diagram of a noise subsystem 600 constructed according to the invention for estimating the ambient noise inside the passenger compartment of an automobile. Subsystem 600 may be used, for example, to provide the noise signals for gain control subsystem 512 discussed in connection with FIG. 5.

Subsystem 600 includes a sensor subsystem 610, an address generator 612, a memory device 614, and three digital to analog converters 616, 618, 620. Sensor subsystem 610 includes a plurality of sensors each of which are partially indicative of the noise level inside the automobile. FIG. 7 shows subsystem 610 including a speedometer 622, a tachometer 624, a vibration sensor 626 which provides an indication of the interaction of the tires and the road surface, a climate control fan sensor 628 which provides an indication of the rotational velocity of the climate control fan, a window position sensor 630, a windshield wiper sensor 632 which provides an indication of the windshield wiper setting (e.g., off, on, low or high), and a transmission sensor 634 which provides an indication of the gear that is currently in use. The outputs of all of these sensors are converted to digital signals by analog to digital converter 636. The digital output of converter 636 is a signal referred to as Sensor Outputs. The Sensor Outputs signal is applied to address generator 612 which converts the Sensor Outputs signal to an address which is applied to memory device 614. Memory device 614 generates three digital output signals NHD, NMD and NLD that are representative of the instantaneous noise level inside the passenger compartment of the automobile in the high, medium, and low frequency bands, respectively. These three signals are converted to analog signals by digital to analog converters 616, 618, 620 to provide three analog signals NHA, NMA, and NLA which are representative of the high frequency, medium frequency, and low frequency noise, respectively, inside the automobile. The three output signals NHA, NMA, and NLA, could serve, for example, as the noise signals which are input to gain control subsystem 512 discussed in connection with FIG. 5.

Prior to use of system 600, an appropriate table of noise data is generated and then stored in memory device 614. This table is preferably generated by driving the automobile under a variety of different conditions (e.g., different speeds, different tires, different types of roads) and recording the noise levels inside the automobile for all conditions using high-quality microphones and analysis equipment. For example, if subsystem 610 contains only two sensors, speedometer 622 and window position sensor 630, and if analog to digital converter 636 operates so that five bits are used to represent the output of speedometer 622, and three bits are used to represent the output of window position sensor 630, then the Sensor Outputs signal is an eight bit signal and therefore has 256 possible values (i.e., two raised to the eighth power equals 256). Each of the 256 values represents a different combination of the automobile's speed and window position. The table of noise data for memory device 614 is generated by measuring the noise inside the automobile for each of the 256 values of the Sensor Outputs signal. In operation of system 600, when the car is being driven at a particular speed and the windows are in a particular position, memory device 614 generates at its output the high, medium, and low frequency noise values that were previously recorded corresponding to that speed and window position. If more sensors are used in subsystem 622, or if more bits are used to represent the output of any of the sensors, then the Sensor Outputs signal will have more possible values and the table of noise data will be correspondingly larger.

Address generator 612 may be implemented as a decoding circuit which maps the Sensor Outputs signal to an address of the table of noise values, or alternatively, address generator 612 may be omitted from system 600 and the Sensor Outputs signal may be applied directly to the address input of memory device 614. For example, returning to the two sensor version of subsystem 610 where the Sensor Outputs signal is formed by concatenating a five bit output of speedometer 622 and a three bit output of window position sensor 630, the five bit output of speedometer 622 may be applied to the five least significant bits of the address of memory 614 and the three bit output of window position sensor 630 may be applied to the three most significant bits of the address of memory 614. If the speedometer output equals two (or '00010' in binary) and if the window position sensor output equals seven (or '111' in binary) then the address generated by concatenating these two signals is 226 (or '11100010' in binary) and the noise values stored in memory device 614 at address location 226 are the noise values (i.e., high, medium, and low frequency) that were measured when the speedometer output was two and the window position sensor output was seven.

At any given instant, the output of memory device 614 is representative of the instantaneous value of the noise corresponding to a particular value of the Sensor Outputs signal. As time evolves, and driving conditions change, the output of memory device 614 provides a time varying signal representative of the noise inside the automobile.

The sensors shown in subsystem 610 are representative of the type of sensors that may be included. Other sensors such as a microphone could of course be included. Preferably, each sensor chosen provides additional information about the noise inside the passenger compartment of the vehicle. Each sensor added to subsystem 610 increases both the cost and the accuracy of system 600, so when designing a system for a particular automobile, the cost is preferably balanced against the desired accuracy of the system. In low cost automobiles, it may be preferable to construct subsystem 610 using only two or three sensors (e.g., the speedometer, the tachometer, and the window position sensor), and in high cost automobiles it may be preferable to use many more sensors.

When many sensors are used in subsystem 610, some of the values of the Sensor Outputs signal may correspond to unrealizable driving conditions. For example, it is generally not possible to drive an automobile at very high speeds when the transmission is in first gear. Therefore, a Sensor Outputs value corresponding to the maximum possible output of speedometer 622 and an output of transmission sensor 634 indicative of first gear is unlikely to ever occur during actual driving conditions. It is therefore unimportant what data is stored in the table of noise data at address locations corresponding to such unrealizable driving conditions. When subsystem 610 is constructed so that there are many values of the Sensor Outputs signal corresponding to unrealizable driving conditions, it is possible to use a memory device 614 of reduced size so that all (or most of) the address locations of memory 614 correspond to realizable driving conditions. In this case, address generator 612 may be used to map the Sensor Outputs signal to an address having fewer bits than the Sensor Outputs signal, so that for each value of the Sensor Outputs signal, address generator 612 generates an address corresponding to the memory location where the noise values associated with that value of the Sensor Outputs signal are stored.

Analog to digital converter 636 may be implemented using a different converter for each sensor, or alternatively, all the sensors in subsystem 610 may share one converter with a multiplexing and buffering arrangement. This may be preferable since it reduces the number of analog to digital converters used in the system and therefore reduces the cost of the system. Further, a single analog to digital converter may provide adequate performance since the output values of the sensors typically change very slowly compared to electronic switching speeds (e.g., 10 MHz).

Memory device 614 may be implemented as any form of digital memory such as a look up table (LUT), magnetic or optical disk, dynamic random access memory (DRAM), or the like.

As was stated above, generating the table of noise data which is stored in memory device 614 involves characterizing the automobile by driving it under a variety of conditions and accurately measuring the noise for each condition. However, this process need only be performed once for any given type of automobile, and therefore may be performed with a high degree of accuracy using expensive, high quality, microphones. For example, once a certain model of car has been characterized, the same table may be used for all cars of that model. Similarly, it may be possible to generate a table of noise data that is accurate for a group of automobiles which share a similar noise profile.

When generating the table of noise values it is preferable to measure the noise several different times for any given value of the Sensor Outputs signal. The values stored in each address location of memory device 614 may be an average of all the measurements made corresponding to that address location, or alternatively instead of an average value it may be preferable to store the lowest recorded value to prevent an audio system that uses these values from over responding to the noise.

In an alternative embodiment of system 600, the measured noise values are not stored in memory device 614, and instead the "noise masking values" corresponding to each measured noise value are stored in memory 614. A noise masking value represents the effect that a given noise level has on an audio signal, see, for example, *The Science of Sound*, Thomas D. Rossing, 2nd ed. Addison-Wesley, 1990, pp. 101–106. Since noise at a given frequency may mask frequencies both above and below the given frequency, it may be desirable to store the noise masking values rather than the noise values themselves.

System 600 has many advantages. Many of the sensors used in sensor subsystem 610 are already present in most automobiles (e.g., speedometer). System 600 also provides a simple method of generating signals representative of the noise power in a multitude of frequency bands, including frequency bands which contain not only ambient noise but also human speech and desired audio signal components. Further, system 600 is highly flexible and customizable and is readily adapted to different vehicles. Finally, increased accuracy may be attained through the incorporation of additional sensors and a correspondingly greater amount of a priori information about the given vehicle; the use of empirical memory tables allows the complex and typically non-linear relationships between vehicle parameters and interior ambient noise to be easily captured with a minimum of processing.

System 600 has been discussed in connection with estimating the ambient noise level in an automobiles although as those skilled in the art will appreciate, in other forms, system 600 may be used to estimate the ambient noise level in any listening space, for example in listening spaces in which audio reproduction systems generate acoustic signals, or in other listening spaces in which it is desirable to estimate the noise level. In such forms of system 600, sensor subsystem 610 preferably contains sensors indicative of the noise level in the listening space.

Figure 8:
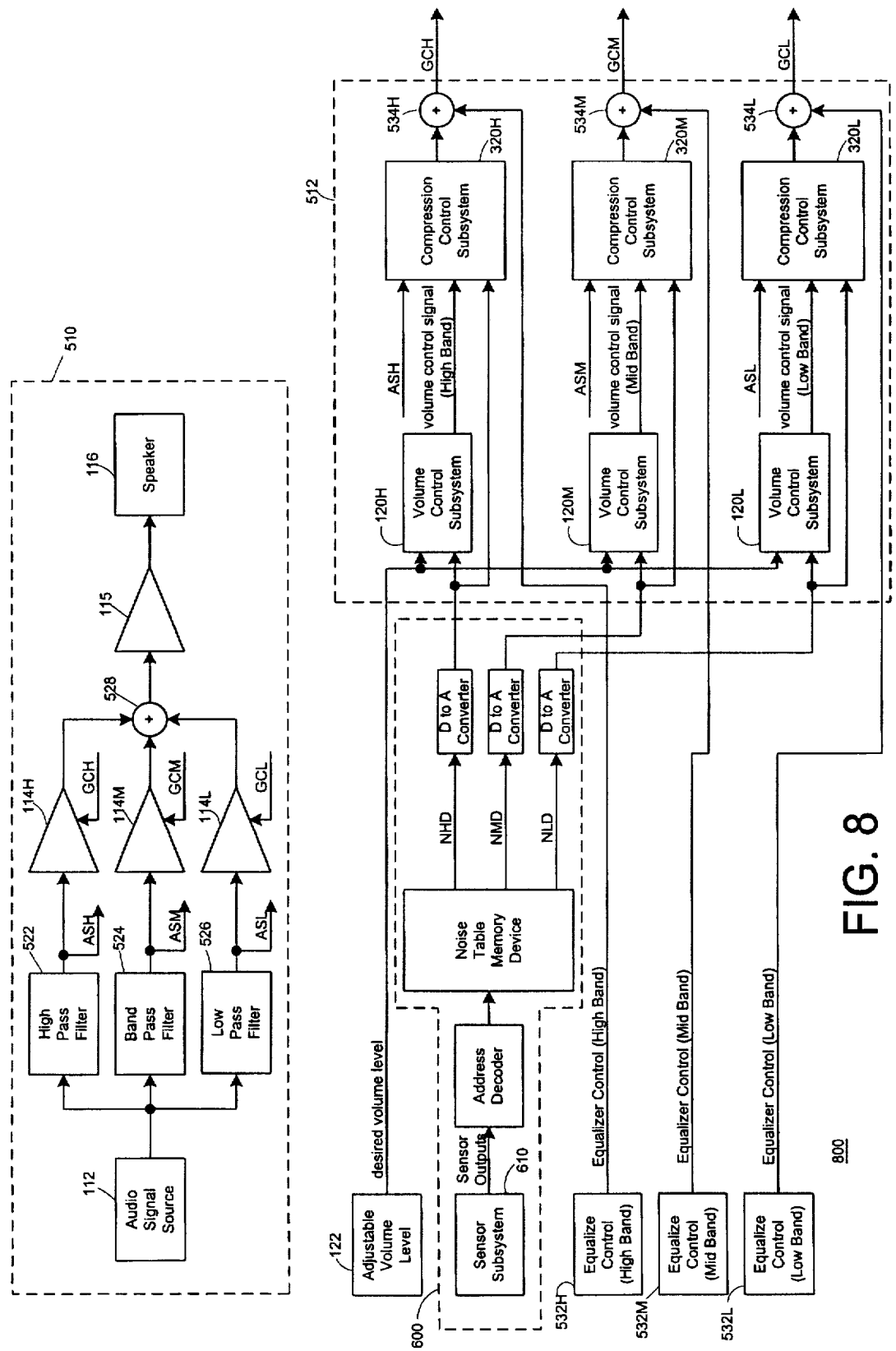
FIG. 8 is a block diagram of a multi-band audio signal processing system constructed according to the invention using the noise estimation subsystem shown in FIG. 7.

FIG. 8 shows a block diagram of a multi-band automotive audio signal processing system 800 constructed according to the invention. System 800 is similar to system 500 discussed in connection with FIG. 5, however, in system 800, the noise signals are generated by noise subsystem 600.

Figure 9:
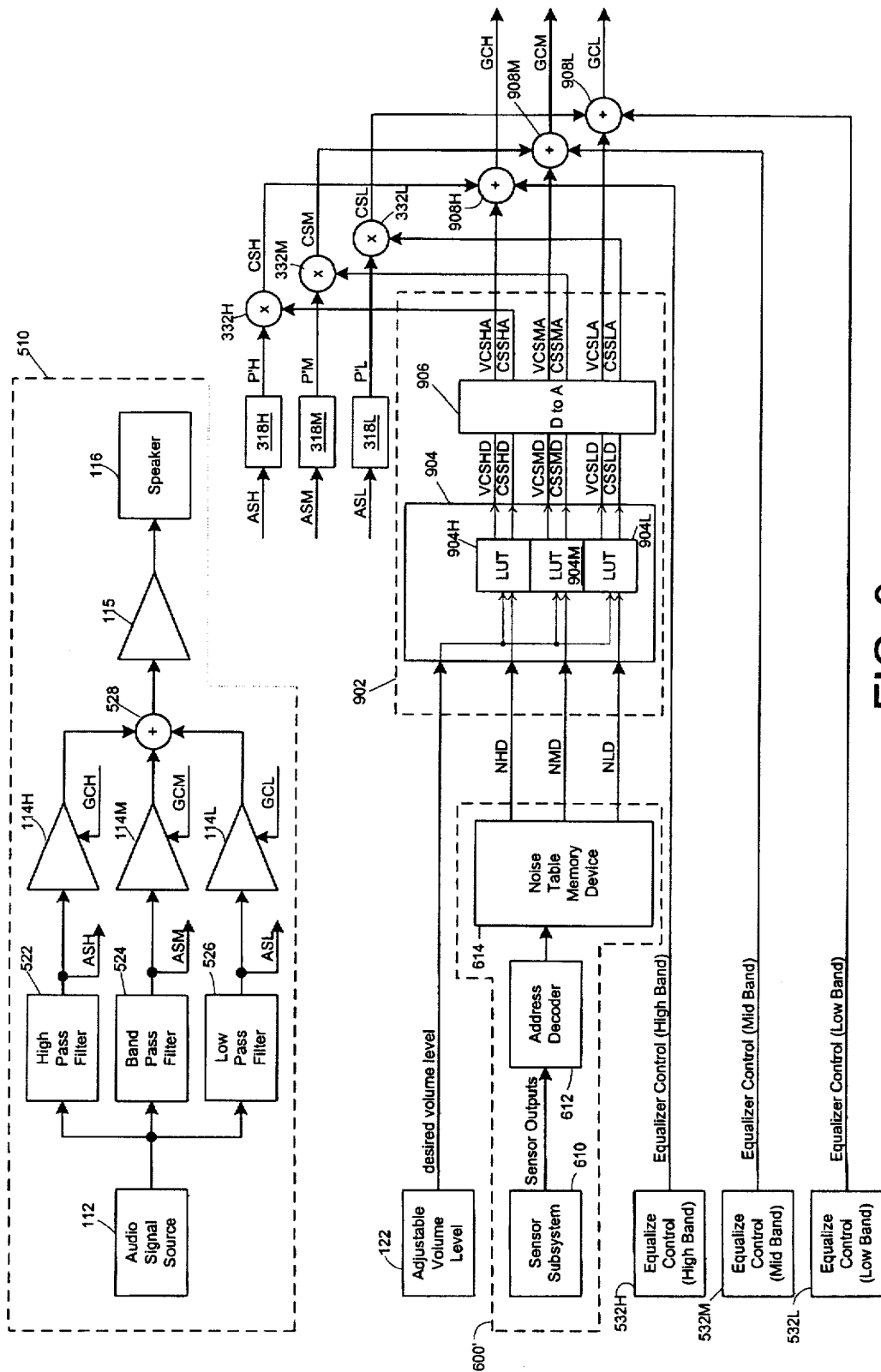
FIG. 9 is a block diagram of a multi-band audio signal processing system constructed according to the invention using a digital memory based gain control subsystem.

FIG. 9 shows a block diagram of a multi-band automotive audio signal processing system 900 constructed according to the invention. System 900 is similar to system 800, however rather than using volume control and compression setting subsystems, system 900 uses a "volume control and compression setting digital memory device" 904 to digitally generate the desired volume control and compression setting signals.

Since device 904 accepts digital inputs, system 900 uses a noise generating subsystem 600' which is similar to subsystem 600 however it does not include digital to analog converters to convert the noise signals generated by memory 614 to analog signals. Rather, the digital noise signals NHD, NMD, and NLD generated by memory device 614 are applied directly to address inputs of memory device 904. The desired volume level signal (which is now assumed to be a digital signal) is also applied to an address input of memory device 904. System 900 also includes a digital to analog converter 906 for converting the digital outputs of memory device 904 to analog signals. System 900 further includes power subsystems 318H, 318M, 318L and multipliers 332H, 332M, 332L, which are high, medium, and low band versions of the components 318, 332, respectively, discussed in connection with FIG. 3. System 900 also includes three three-input adders 908H, 908M, 908L.

Memory device 904 receives four inputs, the desired volume level signal and the three noise signals NHD, NMD, NLD. From these inputs, memory device 904 generates six output signals: high band, medium band, and low band digital volume control signals VCSHD, VCSMD, VCSLD, and high band, medium band, and low band digital compression setting signals CSSHD, CSSMD, CSSLD. These six output signals are converted to six corresponding analog signals VCSHA, VCSMA, VCSLA, CSSHA, CSSMA, CSSLA by digital to analog converter 906.

The three power subsystems 318H, 318M, 318L, generate three power signals P'H, P'M, P'L from the three filtered audio signals ASH, ASM, ASL, respectively. Multiplier 332H multiplies the high band power signal P'H and the high band analog compression setting signal CSSHA to generate a high band compression signal CSH. Multiplier 332M multiplies the medium band power signal P'M and the medium band analog compression setting signal CSSMA to generate a medium band compression signal CSM. Multiplier 332L multiplies the low band power signal P'L and the low band analog compression setting signal CSSLA to generate a low band compression signal CSL.

The high band equalizer control signal, volume control signal VCSHA, and compression signal CSH are applied to the inputs of adder 908H which sums these three inputs to generate the high band gain control signal GCH. The medium band equalizer control signal, volume control signal VCSMA, and compression signal CSM are applied to the inputs of adder 908M which sums these three inputs to generate the medium band gain control signal GCM. The low band equalizer control signal, volume control signal VCSLA, and compression signal CSL are applied to the inputs of adder 908L which sums these three inputs to generate the low band gain control signal GCL.

As shown in FIG. 9, memory device 904 may be implemented using three separate LUTs (or other forms of memory storage devices) 904H, 904M, 904L. As those skilled in the art will appreciate, memory device 904 may alternatively be implemented using a single LUT, however, this increases the size of the address of the LUT. In the illustrated embodiment, each of the three LUTs 904H, 904M, 904L receives two inputs, the desired volume level signal and one of the three noise signals. These two inputs are applied to the address inputs of each LUT and each LUT generates in response a corresponding digital volume control signal and a digital compression setting signal.

Each LUT 904H, 904M, 904L operates in a similar fashion as memory device 614 used in noise subsystem 600'. For example, LUT 904L stores a low band "volume control and compression setting" table. For every combination of the low band noise signal and the desired volume level signal, LUT 904L stores corresponding values of the low band digital volume control signal VCSLD and the low band digital compression setting signal CSSLD. In one form of system 900, the values stored in memory device 904 are equal to the values that would have been generated by the volume control subsystems 120H, 120M, 120L and the compression subsystems 320H, 320M, 320L of gain control subsystem 512 (shown in FIG. 5). As those skilled in the art will appreciate, these values can easily be precalculated for all possible combinations of the input signals and stored in memory device 904. Memory device 904 may also provide compensation equivalent to that provided by scaling devices 536H, 536M, 536L in subsystem 512 so as to preserve tonal balance as the desired volume level signal changes. So in this form, system 900 functions in a fashion that is equivalent to system 500.

However, since memory device 904 can store any desired values for the volume control and compression setting signals, rather than store the values of the signals that subsystem 512 would have produced, it may be preferable to empirically determine the values of the signals that are stored in memory device 904. For example, for each possible combination of the desired volume level signal and the noise signals, an audio engineer may determine the value of the volume control and compression setting signals that produce the most pleasing acoustic signal (i.e., the optimum volume and tonal balance), and these values may be stored in memory device 904. This method has the advantage that it allows simultaneous implementation of a noise compensation scheme (to solve the problems of apparent volume, uneven masking, and dynamic range), a dynamic loudness control, and a means of compensating for the frequency response of the audio reproduction equipment. The use of empirically determined control signal (i.e., volume control and compression setting) values enables such improvements to be carried out simultaneously and eliminates the need to integrate various compensatory elements.

Analog to digital converter 906 may be implemented as six separate analog to digital converters for converting the six output signals of memory device 904 to analog signals. Alternatively, analog to digital converter 906 may be implemented as a single analog to digital converter which is shared via a time multiplexing scheme by the six output signals generated by memory device 904. This arrangement may be preferable since it reduces the number of analog to digital converters and therefore lowers the cost of system 900. Further, since the volume control and compression setting signals in general change relatively slowly compared to the audio signal, a relatively slow and inexpensive analog to digital converter may be used to implement converter 906.

In the illustrated embodiment of system 900, the audio signals ASH, ASM, ASL and the gain control signals GCH, GCM, GCL are shown as analog signals. In other forms of the invention, filters 522, 524, 526, and amplifiers 114H, 114M, 114L, of subsystem 510 may be implemented as digital circuits so that the audio and gain control signals are digital signals. In this form the digital to analog converter 906 may be eliminated.

Also, in the illustrated embodiment of system 900, an address generator is not used to generate an address for memory device 904 from the noise and desired volume level signals. Rather, these signals are applied directly to the address inputs of memory device 904. However, as those skilled in the art will appreciate, an address generator similar to generator 612 of subsystem 600' may be used to receive the noise and desired volume level signals and to generate therefrom an address signal which is applied to memory device 904.

One advantage of system 900 is that memory device 904 may store the same table for all types of automobiles. Although the noise profiles of different types of automobiles vary greatly (and the table of noise values stored by memory device 614 therefore preferably varies between automobiles), in general, the desired amounts of compression and volume boost for a given noise level are similar, even for different automobiles. Alternatively, it is of course also possible to develop the table stored in memory device 904 uniquely for each different type of automobile. It may also be preferable to include another input to memory device 904 which is indicative of the type of audio signal source 112 which is producing the audio signal. This would allow device 904 to, for example, use one table for a CD player and another table for a radio.

Figure 10A:
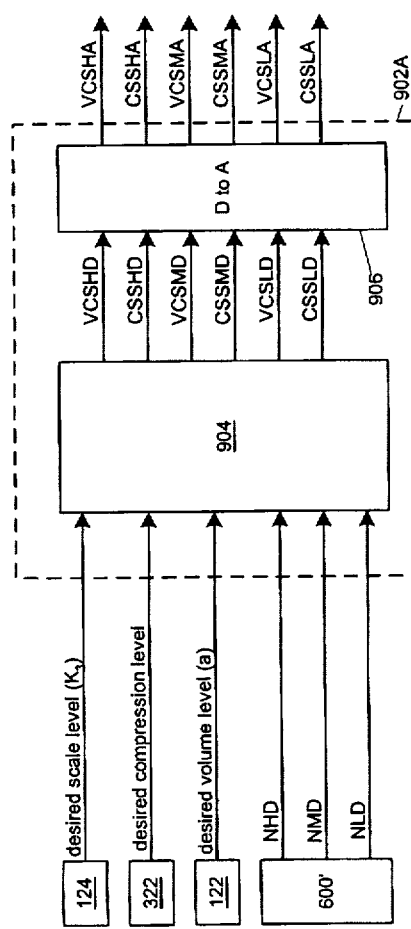
FIGS. 10A–B are block diagrams of different forms of the gain control subsystem shown in FIG. 9 which provide for user control of the volume control and compression setting signals.
Figure 10B:
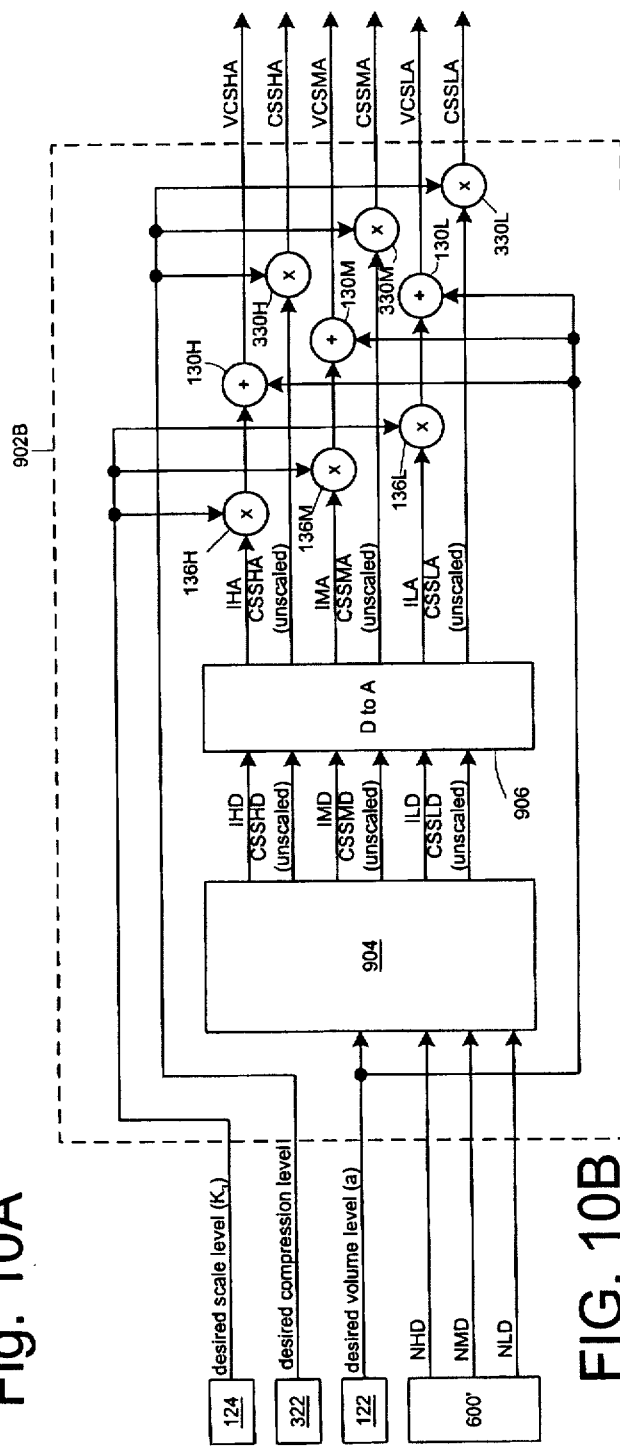

In system 900 the memory device 904 and digital to analog converter 906 may be considered as a control subsystem 902 used for generating the volume control and compression setting signals. System 900 does not include devices 124, 322 (discussed in connection with FIGS. 1 and 3) for providing listener control of the volume control and compression setting signals. FIGS. 10A and 10B illustrate alternative embodiments of subsystem 902 which may be used in system 900 to provide such control.

FIG. 10A is a block diagram of subsystem 902A in which the desired scale level and desired compression level signals (which are now assumed to be digital signals) generated by devices 124, 322 are applied to the address inputs of memory device 904. As those skilled in the art will appreciate, subsystem 902A provides for listener control of the volume control and compression setting signals at the expense of increasing the size of the address of memory device 904.

FIG. 10B is a block diagram of subsystem 902B in which listener control of the volume control and compression setting signals is provided without increasing the size of memory device 904. Subsystem 902B includes three volume control scaling devices 136H, 136M, 136L, three adders 130H, 130M, 130L, and three compression scaling devices 330H, 330M, 330L.

In subsystem 902B, memory device 904 stores a modified version of the volume control table. Rather than store the volume control signals directly, memory device 904 stores intermediate signals which are equal to the volume control signals minus the desired listening level signals. These intermediate signals correspond to the signal that is generated at the output of multiplier 134 (discussed in connection with FIG. 1). The three intermediate signals are a high band digital intermediate signal IHD, a medium band digital intermediate signal IMD, and a low band digital intermediate signal ILD. The three intermediate signals IHD, IMD, ILD are converted to three corresponding analog signals IHA, IMA, ILA by digital to analog converter 906. Each of the high, medium, and low band analog intermediate signals IHA, IMA, ILA are applied to a respective input of scaling devices 136H, 136M, 136L, and the desired scale level signal is applied to the other input of each of the three scaling devices 136H, 136M, 136L. The three scaling devices 136H, 136M, 136L are high, medium, and low band versions of scaling device 136 (discussed in connection with FIG. 1). The three output signals generated by scaling devices 136H, 136M, 136L are applied to a respective input of the three adders 130H, 130M, 130L and the desired volume level signal is applied to the other input of these adders. Each of the three adders 130H, 130M, 130L generates an output signal equal to the sum of its two inputs and these outputs are respectively, the high, medium, and low band volume control signals VCSHA, VCSMA, VCSLA.

The three compression setting signals generated by memory 904 are converted to analog signals by converter 906 and are applied to a respective input of one of the three compression scaling devices 330H, 330M, 330L. The desired compression level signal is applied to the other input of compression scaling devices 330H, 330M, 330L, and these devices generate the scaled compression setting signals CSSHA, CSSMA, CSSLA. The three compression scaling devices 330H, 330M, 330L correspond to the scaling device 330 discussed in connection with FIG. 3.

Figure 11:
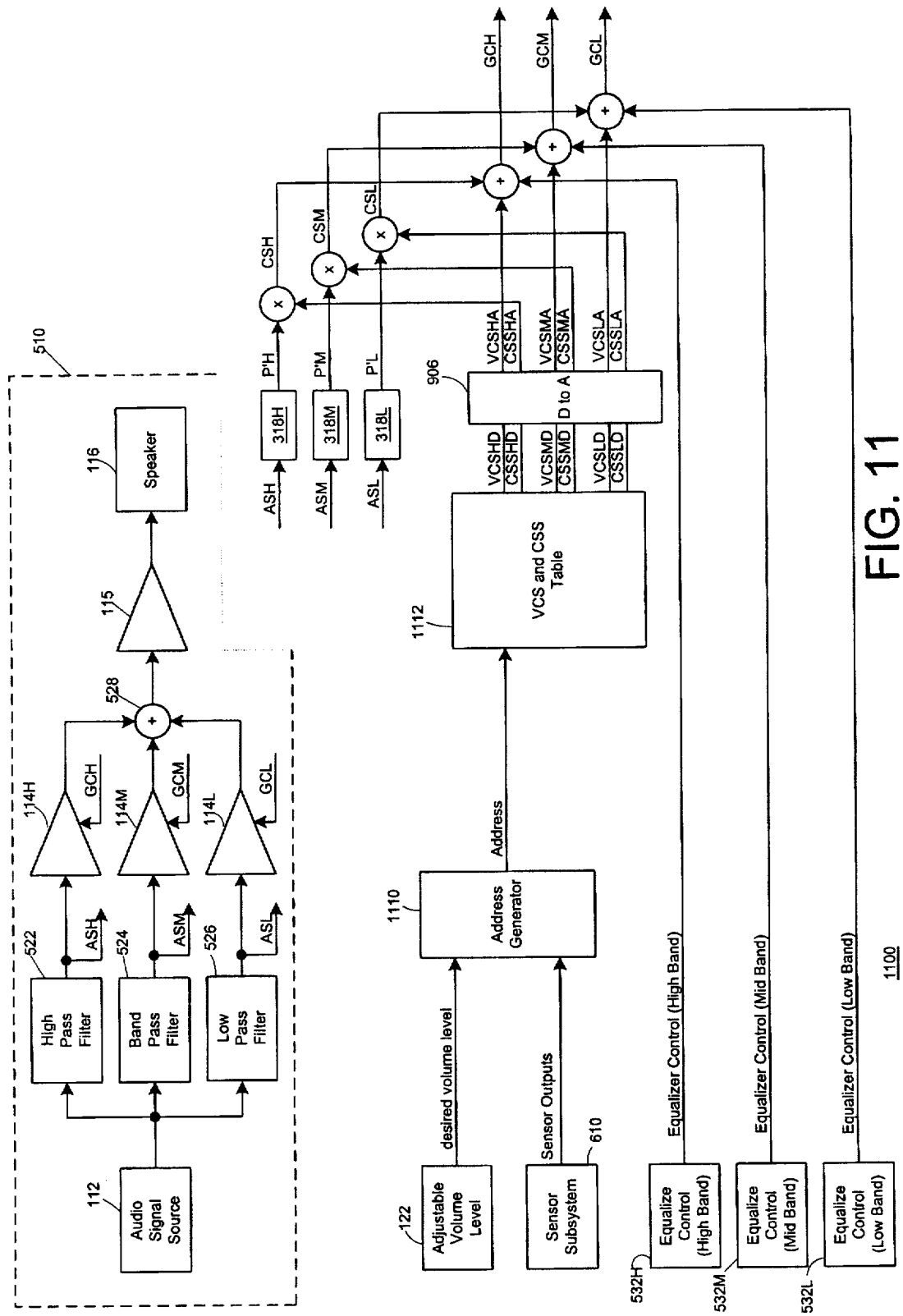
FIG. 11 is a block diagram of a multi-band audio signal processing system constructed according to the invention using a single digital memory to replace the two digital memories used in the system shown in FIG. 9.

FIG. 11 shows a block diagram of a multi-band automotive audio signal processing system 1100 constructed according to the invention. System 1100 is similar to system 900, however, in system 1100, rather than using two memory devices, one to store a noise table and one to store a volume control and compression setting table, system 1100 uses a single memory device 1112.

In system 1100 the desired volume level signal and the Sensor Outputs signal are applied to the inputs of an address generator 1110. Generator 1110 generates an address signal from these inputs which is applied to memory device 1112, and memory device 1112 in turn generates the digital volume control and compression signals.

Memory device 1112 combines the functions of memory devices 614, 904 of system 900. In one form of the invention, the values of the volume control and compression setting signals stored in memory device 1112 may be equal to the values that would have been generated by system 800 (shown in FIG. 8). These values may be precalculated and stored in memory device 1112. In this form, system 1100 functions in an equivalent fashion as system 800.

In other forms of system 1100, rather than store the values that would have been generated by system 800, it may be preferable to empirically determine the values. In this form, the table stored by memory device 1112 is generated by characterizing the automobile by driving the automobile under a variety of different driving conditions, and empirically determining the values of the volume control and compression setting signals which produce the most pleasing acoustic signal for each combination of the desired volume level and Sensor Outputs signals.

System 1100 has the advantage that it requires only a single memory table; this eliminates the need to determine the noise values and saves data space. As in the case of system 900, it is possible through empirical determination of the most pleasing control signal values to simultaneously implement a noise compensation scheme, a dynamic loudness control, and to provide compensation for the frequency response of the audio reproduction equipment.

Figure 12:
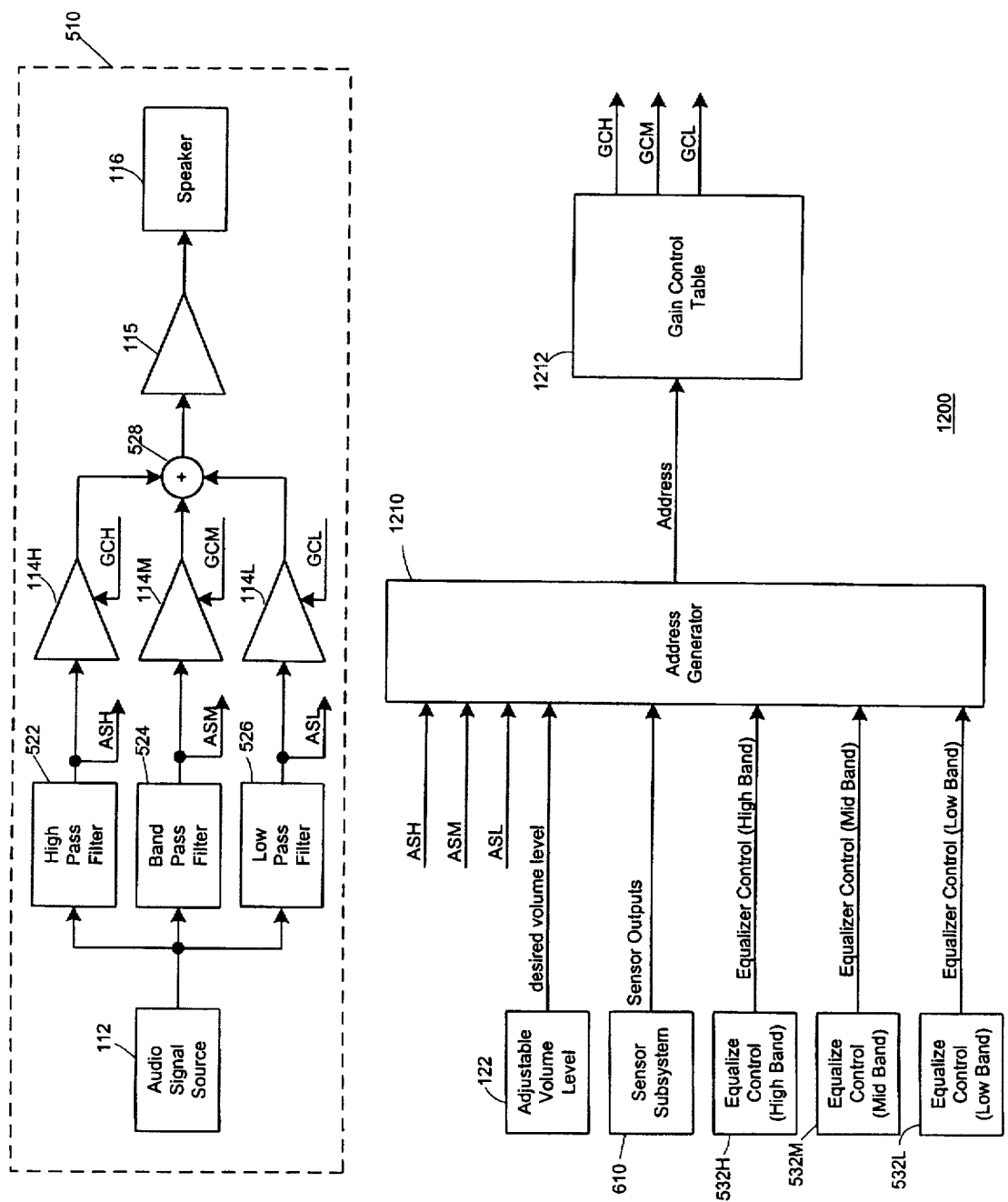
FIG. 12 is a block diagram of another multi-band audio signal processing system constructed according to the invention.

FIG. 12 shows a block diagram of a multi-band automotive audio signal processing system 1200 constructed according to the invention. System 1200 is similar to system 1100, however, in system 1200 rather than using analog components to convert the volume control and compression setting signals stored by the memory device to the gain control signals, the memory device 1212 stores the gain control signals directly.

In system 1200, the filtered audio signals ASH, ASM, ASL, the desired volume level signal, the Sensor Outputs signal, and the equalizer control signals are all applied to an address generator 1210 which in turn generates an address signal that is applied to memory device 1212. In response to this address signal, memory device 1212 generates the gain control signals which are applied to the amplifiers of subsystem 510. As illustrated in FIG. 12, the filters 522, 524, 526, and amplifiers 114H, 114M, 114L are presumed to be digital circuits so that the audio signals ASH, ASM, ASL, and the gain control signals GCH, GCM, GCL are digital signals. In alternative embodiments in which these signals are analog signals, the audio signals ASH, ASM, ASL may be converted to digital signals before being applied to address generator 1210 and the three gain control signals GCH, GCM, GCL may be converted to analog signals prior to being applied to amplifiers 114H, 114M, 114L.

The invention may be embodied in other specific forms without departing from the spirit or essential characteristics thereof. For example, the invention has been described in terms of use with an automotive audio reproduction system. However, those skilled in the art will appreciate that the invention may be used in an audio reproduction system that operates in any type of environment, or listening space, in which the noise is dynamically changing, for example, in boats, airplanes, restaurants, and the like. Further, the invention may be used in an audio reproduction system that operates in a listening space in which the noise is relatively constant, for example in a factory or a living room. In this case, the noise signals are preferably simply set to appropriate constant values, and may be adjusted by the user if noise conditions change. Further, the invention has generally been discussed in terms of three band audio reproduction systems. Techniques taught by the invention may be used to construct an audio reproduction system having an arbitrary number of bands.

Further, whereas the invention has been discussed in terms of a single channel audio reproduction system, the invention may also be used in multi-channel systems, such as stereo systems which typically have a left channel and a right channel. In some embodiments, the control signals (i.e., the volume control and compression setting signals) are generated independently in each channel, however, these embodiments use large numbers of components (since each channel includes its own volume control and compression subsystems). In other embodiments using fewer components, the control signals are not generated independently in each channel. For example, in one such stereo system the same control signals are used in both channels, and the compression setting signals are generated based on the sum of the left and right channel line signals. Balance control (i.e., for controlling the relative loudness between the left and right channels) may simply be implemented using a potentiometer, or other voltage divider, to selectively divide a volume control signal into left and right channel volume control signals. In stereo systems constructed according to the invention it may be desirable to generate different control signals for each channel depending on the state of a balance control knob. This may simply be accomplished by constructing each channel so that it includes its own volume control and compression subsystems, or alternatively, may be accomplished by systems using digital memory devices such as system 900 illustrated in FIG. 9. In systems using digital memory devices, the digital memory may include an extra input for the balance position setting, and may store left and right channel control signal values for each balance position setting. Alternatively, rather than using the memory device to store two values of the control signals for each balance position setting, the left and right channels may share the digital memory device in a multiplexed fashion and thereby may use a memory device having reduced storage capacity. In this embodiment, the address input to the memory device is alternatively switched between the left and right channel balance position settings and the memory device thereby alternatively generates the left and right channel control signals. Such systems use simple sample and hold devices to store the control signals for one channel when the memory device is generating the control signals for the other channel. Similar methods may of course be used in multi-channel systems, such as stereo automotive audio systems which typically have four channels (i.e., left, right, front, and back) and include both balance and fader controls.

The present embodiments are therefore to be considered in all respects as illustrative and not restrictive, the scope of the invention being indicated by the appended claims rather than by the foregoing description, and all changes which come within the meaning and band of equivalency of the claims are therefore intended to be embraced therein.

What is claimed is:

1. An audio signal processing system for application to an audio transducer to produce an acoustic signal in a listening space, comprising:
   A. means for generating a desired volume signal representative of a desired volume of said acoustic signal in said listening space;
   B. noise means for generating a noise signal representative of an ambient noise condition in the listening space;
   C. variable gain amplification means for receiving an audio signal and a gain control signal and for amplifying said audio signal in accordance with said gain control signal to generate an output signal;
   D. volume control means for generating a volume control signal in response to said desired volume signal and said noise signal, said volume control signal being representative of amplification corresponding to a monotonically increasing value as a function of increase of said ambient noise condition wherein the rate of increase as a function of said ambient noise condition is monotonically decreasing; and
   E. gain control means for generating said gain control signal in response to said volume control signal.

2. An audio signal processing system for application to an audio transducer to produce an acoustic signal in a listening space, comprising:
   A. means for generating a desired volume signal representative of a desired volume of said acoustic signal in said listening space;
   B. noise means for generating a noise signal representative of an ambient noise condition in the listening space;
   C. variable gain amplification means for receiving an audio signal and a gain control signal and for amplifying said audio signal in accordance with said gain control signal to generate an output signal;
   D. volume control means for generating a volume control signal in response to said desired volume signal and said noise signal, said volume control signal being representative of amplification (i) corresponding to a monotonically increasing value as a function of increase of said ambient noise condition wherein the rate of increase as a function of said ambient noise condition is monotonically decreasing, and (ii) corresponding to a monotonically increasing value as a function of increase of said desired volume wherein the rate of increase as a function of said desired volume is monotonically decreasing; and
   E. gain control means for generating said gain control signal in response to said volume control signal.

3. An audio signal processing system according to claim 2, wherein said volume control means includes means for generating a rate signal that decreases monotonically as said volume control signal increases and that increases as said volume control signal decreases.

4. An audio signal processing system according to claim 3, wherein said volume control means further includes means for generating a product signal by multiplying said noise signal and said rate signal.

5. An audio signal processing system according to claim 4, wherein said volume control means further includes means for generating said volume control signal by adding said desired volume signal and said product signal.

6. An audio signal processing system according to claim 4, wherein said volume control means further includes scale means for scaling said product signal in response to a user controlled signal.

7. An audio signal processing system according to claim 2, wherein said gain control means generates said gain control signal in response to said volume control signal and said audio signal.

8. An audio signal processing system according to claim 2, further including compression means for generating a compression signal in response to said audio signal, said noise signal, and said volume control signal.

9. An audio signal processing system according to claim 8, wherein said gain control means includes means for generating said gain control signal by summing said compression signal and said volume control signal.

10. An audio signal processing system according to claim 8, wherein said compression signal decreases as said audio signal increases from a third value to a fourth value.

11. An audio signal processing system according to claim 10, wherein said compression signal is substantially zero when said audio signal is less than said third value.

12. An audio signal processing system according to claim 11, wherein said compression signal is substantially zero when said audio signal is greater than said fourth value.

13. An audio signal processing system according to claim 8, including means for generating a compression setting signal related to a difference between said volume control signal and said noise signal.

14. An audio signal processing system according to claim 13, including means for generating a power signal that decreases as said audio signal increases from a third value to a fourth value.

15. An audio signal processing system according to claim 14, wherein said power signal is substantially zero when said audio signal is less than said third value.

16. An audio signal processing system according to claim 15, wherein said power signal is substantially zero when said audio signal is greater than said fourth value.

17. An audio signal processing system according to claim 14, wherein said compression means generates said compression signal by multiplying said power signal and said compression setting signal.

18. An audio signal processing system according to claim 13, including means for scaling said compression setting signal in response to a user controlled signal.

19. An audio signal processing system according to claim 8, including means for generating a diff signal representative of a difference between said volume control signal and said noise signal.

20. An audio signal processing system according to claim 19, including limiting means for generating a limited signal in response to said diff signal, said limited signal being equal to said diff signal when said diff signal is greater than a threshold and said limited signal being equal to said threshold when said diff signal is less than said threshold.

21. An audio signal processing system according to claim 20, including means for generating a compression setting signal in response to said limited signal, said compression setting signal being generated by shifting said limited signal.

22. An audio signal processing system according to claim 20, including means for generating a compression setting signal in response to said limited signal, said compression setting signal being generated by shifting and scaling said limited signal.

23. An audio signal processing system according to claim 22, further including means for scaling said compression setting signal by a user controlled signal.

24. An audio signal processing system according to claim 22, further including means for generating a power signal representative of a power level of said audio signal.

25. An audio signal processing system according to claim 24, wherein said compression means generates said compression signal as a product of said power signal and said compression setting signal.

26. An audio signal processing system according to claim 8, wherein said compression means includes limiting means for preventing said compression signal from exceeding a predetermined value.

27. An audio signal processing system according to claim 2, wherein said noise means includes means for generating a plurality of noise signals, each of said noise signals being representative of the ambient noise conditions in the listening space in an associated frequency band.

28. An audio signal processing system according to claim 27, wherein said noise means includes means for generating at least one of said noise signals by multiplying another of said noise signals by a scale factor.

29. An audio signal processing system according to claim 27, wherein said volume control means includes means for generating a plurality of volume control signals.

30. An audio signal processing system according to claim 29, wherein said volume control means includes means for generating at least one of said volume control signals by multiplying another of said volume control signals by a scale factor.

31. An audio signal processing system according to claim 29, further including means for scaling said desired volume signal by a plurality of constants to generate a plurality of volume signals and means for applying said plurality of volume signals to said volume control means.

32. An audio signal processing system according to claim 29, further comprising filter means for receiving and filtering an audio signal and generating a plurality of filtered audio signals, each of said filtered audio signals containing frequency components from an associated frequency band, and wherein said gain control means includes means for generating a plurality of gain control signals, and wherein said variable gain amplifying means includes means for receiving said plurality of filtered audio signals and said plurality of gain control signals, and means for amplifying each of said filtered audio signals in accordance with a corresponding one of said gain control signals.

33. An audio signal processing system according to claim 32, wherein said gain control means includes means for generating each of said gain control signals in response to one of said volume control signals.

34. An audio signal processing system according to claim 32, further including means for generating a plurality of compression signals, and means for generating each of said gain control signals by summing one of said volume control signals and one of said compression signals.

35. An audio signal processing system according to claim 34, wherein each of said gain control signals is generated by summing one of said volume control signals, one of said compression signals, and an equalizer control signal.

36. An audio signal processing system according to claim 34, wherein one of said compression signals is generated by multiplying another of said compression signals by a scale factor.

37. An audio signal processing system according to claim 34, wherein each of said compression signals is generated in response to a corresponding one of said filtered audio signals, a corresponding one of said volume control signals, and a corresponding one of said noise signals.

38. An audio signal processing system according to claim 37, wherein each of said gain control signals is generated by summing one of said volume control signals, one of said compression signals, and an equalizer control signal.

39. An audio signal processing system according to claim 27, wherein said volume control means includes a plurality of volume control subsystems, each of said volume control subsystems generating an associated volume control signal in response to said desired volume signal and an associated one of said noise signals, each of said volume control signals increasing at a rate of increase as its associated volume control signal increases from a first value to a second value, said rate of increase decreasing as its associated volume control signal increases from said first value to said second value.

40. An audio signal processing system according to claim 39, further including scale means for generating a plurality of scaled volume signals in response to said desired volume signal, each of said volume control subsystems generating its associated volume control signal in response to one of said scaled volume signals and its associated one of said noise signals.

41. An audio signal processing system according to claim 2, wherein said noise means comprises a microphone.

42. An audio signal processing system according to claim 2, wherein said noise means comprises:
  A. memory means for storing a plurality of noise values at locations therein, each of said noise values being representative of the ambient noise associated with a corresponding set of conditions of said listening space,
  B. address means for generating an address signal in response to a current set of said conditions of said listening space so that said address signal accesses a location of said memory means storing the noise value associated with said current set of said conditions; and
  C. noise signal means, responsive to said address signal, for generating said noise signal, said noise signal corresponding to the noise value associated with said current set of conditions so that said noise signal is representative of the ambient noise level.

43. An audio signal processing system according to claim 2, wherein said listening space comprises a passenger compartment of an automobile.

44. An audio signal processing system according to claim 43, wherein said noise means comprises a speedometer.

45. An audio signal processing system according to claim 2, wherein said volume control means comprises,
  A. memory means for storing a plurality of volume control values at locations therein, each of said volume control values being representative of a value of said volume control signal associated with a set of values of said desired volume signal, and said noise signal;
  B. address means for generating an address signal in response to a current set of values of said desired volume level, and said noise signal, so that said address signal accesses a location of said memory means storing the volume control value associated with said current set of values; and
  C. volume control signal means, responsive to said address signal, for generating said volume control signal, said volume control signal corresponding to the volume control value associated with said current set of values.

46. An audio signal processing system for application to an audio transducer to produce an acoustic signal in a listening space, comprising:
  A. means for generating a desired volume signal representative of a desired volume of said acoustic signal in said listening space;
  B. noise means for generating a noise signal representative of an ambient noise condition in the listening space;

C. variable gain amplification means for receiving an audio signal and a gain control signal and for amplifying said audio signal in accordance with said gain control signal to generate an output signal;

D. volume control means for generating a volume control signal, said volume control signal being representative of amplification corresponding to a monotonically increasing value as a function of increase of said ambient noise condition wherein the rate of increase as a function of said ambient noise condition is monotonically decreasing, including, i. memory means for storing a plurality of volume control values at locations therein, each of said volume control values being representative of a value of said volume control signal associated with a set of values of said desired volume signal, and said noise signal;

ii. address means for generating an address signal in response to a current set of values of said desired volume level, and said noise signal, so that said address signal accesses a location of said memory means storing the volume control value associated with said current set of values;

iii. volume control signal means, responsive to said address signal, for generating said volume control signal, said volume control signal corresponding to the volume control value associated with said current set of values; and E. gain control means for generating said gain control signal in response to said volume control signal.

47. An audio signal processing system according to claim 46, wherein said memory means further includes means for generating a compression setting signal in response to said address signal.

48. An audio signal processing system according to claim 46, further including a plurality of audio signal sources each for generating an audio signal.

49. An audio signal processing system according to claim 48, further including selection means for selecting one of said audio signal sources and for applying said audio signal generated by said one audio signal source to said variable gain amplification means, and including means for generating a selection signal indicative of said one audio signal source.

50. An audio signal processing system according to claim 49 wherein said memory means includes means for storing a plurality of volume control values corresponding to each of said audio signal sources and includes means for selecting said volume control values in response to said selection signal.

51. An audio signal processing system according to claim 45, wherein said volume control signal increases at a rate as said noise signal increases.

52. An audio signal processing system according to claim 51, wherein said rate decreases as said noise signal increases.

53. An audio signal processing system for application to an audio transducer to produce an acoustic signal in a listening space, comprising:

A. means for generating a desired volume signal;

B. noise means for generating a noise signal representative of an ambient noise condition in the listening space;

C. variable gain amplification means for receiving an audio signal and a gain control signal and for amplifying said audio signal in accordance with said gain control signal to generate an output signal;

D. volume control means for generating a volume control signal representative of a maximum amplitude of said gain control signal;

E. compression means for generating a power signal representative of a power level of said audio signal and for generating a compression setting signal in response to a difference between said volume control signal and said noise signal and for generating a compression signal as a product of said power signal and said compression setting signal; and E. gain control means for generating said gain control signal in response to said volume control signal and said compression signal.

54. An audio signal processing system for application to an audio transducer to produce an acoustic signal in a listening space, comprising:

A. means for generating a desired volume signal representative of a desired volume of said acoustic signal in said listening space;

B. means for generating a sensor signal representative of a current set of conditions of said listening space;

C. volume control means for generating a volume control signal, said volume control signal being representative of amplification corresponding to a monotonically increasing value as a function of increase of said ambient noise condition wherein the rate of increase as a function of said ambient noise condition is monotonically decreasing, including, i. memory means for storing a plurality of volume control values at locations therein, each of said volume control values being representative of a value of said volume control signal associated with a set of values of said desired volume signal, and said sensor signal;

ii. address means for generating an address signal in response to a current set of values of said desired volume level, and said sensor signal, so that said address signal accesses a location of said memory means storing the volume control value associated with said current set of values;

iii. volume control signal means, responsive to said address signal, for generating said volume control signal, said volume control signal corresponding to the volume control value associated with said current set of values; and D. means for generating said acoustic signal in response to said volume control signal and an audio signal.

* * * * *